United States Patent
Shirakawa et al.

(10) Patent No.: US 10,276,243 B2
(45) Date of Patent: *Apr. 30, 2019

(54) SEMICONDUCTOR MEMORY DEVICE AND WRITING OPERATION METHOD THEREOF IN WHICH FIRST MEMORY CELLS OF A PAGE THAT ARE IN A FIRST GROUP OF CONTIGUOUS COLUMNS ARE PROGRAMMED AND VERIFIED SEPARATELY FROM SECOND MEMORY CELLS OF THE SAME PAGE THAT ARE IN A SECOND GROUP OF CONTIGUOUS COLUMNS THAT DOES NOT OVERLAP WITH THE FIRST GROUP

(71) Applicant: Toshiba Memory Corporation, Tokyo (JP)

(72) Inventors: Masanobu Shirakawa, Chigasaki Kanagawa (JP); Kenta Yasufuku, Yokohama Kanagawa (JP); Akira Yamaga, Kawasaki Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/876,713

(22) Filed: Jan. 22, 2018

(65) Prior Publication Data
US 2018/0144801 A1 May 24, 2018

Related U.S. Application Data

(63) Continuation of application No. 15/588,560, filed on May 5, 2017, now Pat. No. 9,911,498, which is a
(Continued)

(30) Foreign Application Priority Data
Sep. 11, 2015 (JP) .................................. 2015-179942

(51) Int. Cl.
*G11C 16/04* (2006.01)
*G11C 16/10* (2006.01)
(Continued)

(52) U.S. Cl.
CPC .......... *G11C 16/10* (2013.01); *G11C 11/5628* (2013.01); *G11C 16/0483* (2013.01);
(Continued)

(58) Field of Classification Search
CPC . G11C 16/10; G11C 16/0483; G11C 16/3459; G11C 16/12; G11C 16/34;
(Continued)

(56) References Cited

U.S. PATENT DOCUMENTS 6,917,543 B2 7/2005 Sato
7,027,329 B2 4/2006 Sakuma et al.
(Continued)

FOREIGN PATENT DOCUMENTS

JP 2004-095029 A 3/2004
JP 2005-025898 A 1/2005
(Continued)

OTHER PUBLICATIONS

Japanese Office Action dated May 8, 2018, filed in counterpart Japanese Patent Application No. 2015-179942 (13 pages) (with English Translation).
(Continued)

*Primary Examiner* — Gene N Auduong
(74) *Attorney, Agent, or Firm* — Kim & Stewart LLP

(57) ABSTRACT

A memory system includes a semiconductor memory device having memory cells arranged in rows and columns, and a controller configured to issue a write command with or without a partial page program command to the semiconductor memory device. The semiconductor memory device, in response to the write command issued without the partial
(Continued)

page command, executes a first program operation on a page of memory cells and then a first verify operation on the memory cells of the page using a first verify voltage for all of the memory cells of the page, and in response to the write command issued with the partial page command, executes a second program operation on a subset of the memory cells of the page and then a second verify operation on the memory cells of the subset using one of several different second verify voltages corresponding to the subset.

20 Claims, 23 Drawing Sheets

Related U.S. Application Data continuation of application No. 15/174,527, filed on Jun. 6, 2016, now Pat. No. 9,721,666.

(51) Int. Cl.
    G11C 11/56    (2006.01)
    G11C 16/08    (2006.01)
    G11C 16/34    (2006.01)
    G11C 16/26    (2006.01)

(52) U.S. Cl.
    CPC .............. *G11C 16/08* (2013.01); *G11C 16/26* (2013.01); *G11C 16/34* (2013.01); *G11C 16/3427* (2013.01); *G11C 16/3459* (2013.01); G11C 11/5642 (2013.01); G11C 2211/5641 (2013.01)

(58) Field of Classification Search
    CPC ............ G11C 16/3436; G11C 16/3454; G11C 2213/75; G11C 16/08; G11C 2211/5621
    USPC ............ 365/185.11, 185.12, 185.17, 185.18, 365/185.22, 182.28
    See application file for complete search history.

(56) References Cited

U.S. PATENT DOCUMENTS

| | | | |
|---|---|---|---|
| 7,057,939 B2 | 6/2006 | Li et al. | |
| 7,120,052 B2 | 10/2006 | Shibata et al. | |
| 7,149,116 B2 | 12/2006 | Sakuma et al. | |
| 7,342,830 B1 | 3/2008 | Chen et al. | |
| 7,564,719 B2 * | 7/2009 | Noh | G11C 11/5628 365/185.19 |
| 7,593,266 B2 | 9/2009 | Senoo et al. | |
| 7,656,705 B2 | 2/2010 | Hamilton et al. | |
| 7,859,910 B2 | 12/2010 | Shiga | |
| 8,094,495 B2 | 1/2012 | Toyama | |
| 8,130,556 B2 | 3/2012 | Lutze et al. | |
| 8,451,667 B2 | 5/2013 | Lutze et al. | |
| 8,520,448 B1 | 8/2013 | Lutze et al. | |
| 9,721,666 B2 * | 3/2017 | Shirakawa et al. | G11C 16/10 |
| 9,911,498 B2 * | 3/2018 | Shirakawa et al. | G11C 16/10 |
| 2005/0237814 A1 | 10/2005 | Li et al. | |
| 2006/0114720 A1 | 6/2006 | Shibata et al. | |
| 2007/0171719 A1 | 7/2007 | Hemink et al. | |
| 2009/0040831 A1 | 2/2009 | Noh et al. | |
| 2009/0154244 A1 | 6/2009 | Shiga | |
| 2010/0080060 A1 | 4/2010 | Chen et al. | |
| 2010/0128527 A1 | 5/2010 | Toyama | |
| 2010/0161888 A1 | 6/2010 | Eggleston | |
| 2010/0214844 A1 | 8/2010 | Lee et al. | |
| 2013/0080730 A1 | 3/2013 | Kim | |

FOREIGN PATENT DOCUMENTS

| | | |
|---|---|---|
| JP | 2011-258289 A | 12/2011 |
| JP | 2012-507818 A | 3/2012 |
| WO | 2013006355 A2 | 1/2013 |

OTHER PUBLICATIONS

Taiwanese Office Action dated Feb. 13, 2017, filed in counterpart Taiwanese Patent Application No. 105107239 (13 pages) (with English Translation).

Extended European Search Report dated Jan. 31, 2017, filed in counterpart European Patent Application No. 16182736.5 (8 pages).

* cited by examiner

| Zone | Verify level | ΔVPGM | Pre-verify |
|------|--------------|---------|------------|
| ZN0 | VCG_Z0 | ΔVPGM_Z0 | × |
| ZN1 | VCG_Z1 | ΔVPGM_Z1 | ○/× |
| ZN2 | VCG_Z2 | ΔVPGM_Z2 | ○/× |
| ZN3 | VCG_Z3 | ΔVPGM_Z3 | ○ |

| Mode | Zone | Verify level | ΔVPGM | Pre-prog_verify |
|---|---|---|---|---|
| 4PPP mode | ZN0 | VCG_Z0 | ΔVPGM_Z0 | x |
| | ZN1 | VCG_Z1 | ΔVPGM_Z1 | O／x |
| | ZN2 | VCG_Z2 | ΔVPGM_Z2 | O／x |
| | ZN3 | VCG_Z3 | ΔVPGM_Z3 | O |
| 2PPP mode | ZN0 | VCG_Z0 | ΔVPGM_Z0 | x |
| | ZN1 | VCG_Z3 | ΔVPGM_Z3 | O |

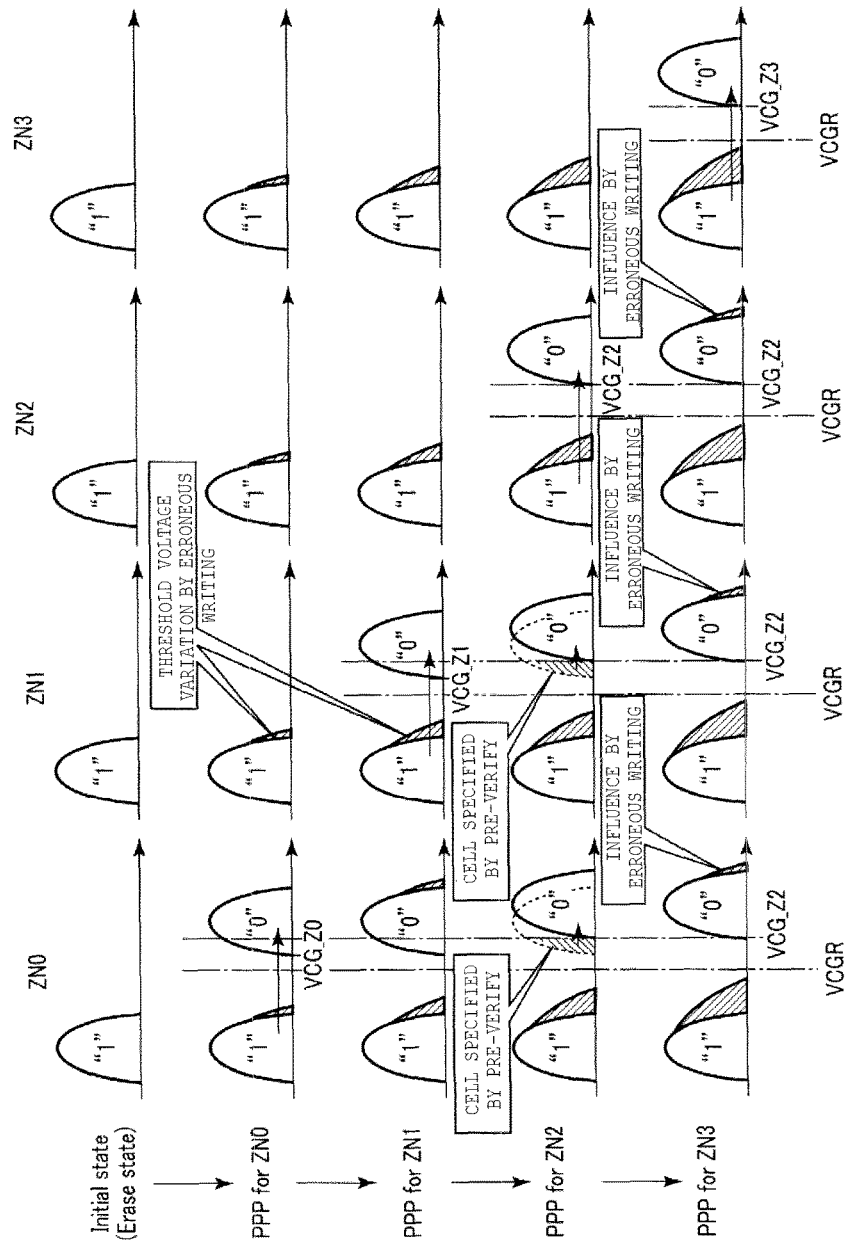

SEMICONDUCTOR MEMORY DEVICE AND WRITING OPERATION METHOD THEREOF IN WHICH FIRST MEMORY CELLS OF A PAGE THAT ARE IN A FIRST GROUP OF CONTIGUOUS COLUMNS ARE PROGRAMMED AND VERIFIED SEPARATELY FROM SECOND MEMORY CELLS OF THE SAME PAGE THAT ARE IN A SECOND GROUP OF CONTIGUOUS COLUMNS THAT DOES NOT OVERLAP WITH THE FIRST GROUP

CROSS-REFERENCE TO RELATED APPLICATIONS

This application a continuation of U.S. patent application Ser. No. 15/588,560, filed on May 5, 2017, which is a continuation of U.S. patent application Ser. No. 15/174,527, filed on Jun. 6, 2016, now U.S. Pat. No. 9,721,666, issued on Aug. 1, 2017, which is based upon and claims the benefit of priority from Japanese Patent Application No. 2015-179942, filed on Sep. 11, 2015, the entire contents of each of which are incorporated herein by reference.

FIELD

Embodiments described herein relate generally to a memory system.

BACKGROUND

A NAND flash memory in which memory cells are arranged in three dimensions is known.

DESCRIPTION OF THE DRAWINGS

FIG. 28 is a schematic diagram illustrating changes in a threshold voltage distribution of memory cells when pre-verify is selected while writing to a second zone in the semiconductor memory device according to the modification example of the first to third embodiments.

DETAILED DESCRIPTION

Figure 1:
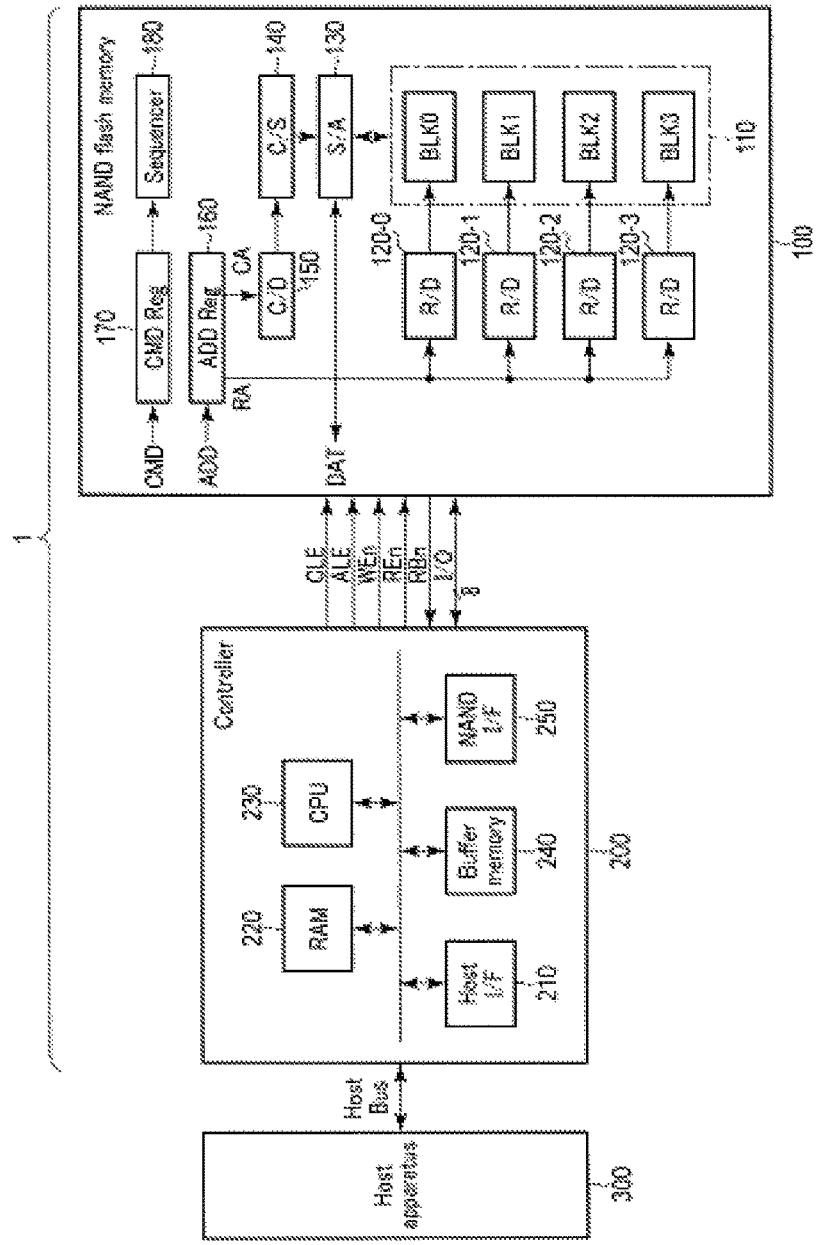
FIG. 1 is a block diagram of a memory system according to a first embodiment.

Embodiments provide a memory system that can improve reliability of operation.

In general, according to one embodiment, a memory system includes a semiconductor memory device having memory cells arranged in rows and columns, and a controller configured to issue a write command with or without a partial page program command to the semiconductor memory device. The semiconductor memory device, in response to the write command issued without the partial page command, executes a first program operation on a page of memory cells and then a first verify operation on the memory cells of the page using a first verify voltage for all of the memory cells of the page, and in response to the write command issued with the partial page command, executes a second program operation on a subset of the memory cells of the page and then a second verify operation on the memory cells of the subset using one of several different second verify voltages corresponding to the subset.

Hereinafter, embodiments will be described with reference to the drawings. In the following description, common reference numerals are given to configuration elements having the same function and configuration.

1. First Embodiment

A memory system according to a first embodiment will be described. Hereinafter, a three-dimensional stacked NAND flash memory, in which the memory cells are arranged in three dimensions and stacked above a semiconductor substrate, is described as an example of a semiconductor memory device.

1.1 Configuration

1.1.1. Entire Configuration of Memory System

First, a general configuration of the memory system according to the embodiment will be described with reference to FIG. 1.

As illustrated in FIG. 1, a memory system 1 includes a NAND flash memory 100 and a controller 200. The NAND flash memory 100 and the controller 200 may, for example, make up one semiconductor memory device by a combination thereof and, examples thereof include a memory card such as a SD™ card, a solid state drive (SSD), and the like.

The NAND flash memory 100 includes a plurality of memory cells and stores data in a non-volatile manner. The controller 200 is connected to the NAND flash memory 100 by a NAND bus and is connected to a host apparatus 300 by a host bus. The controller 200 controls the NAND flash memory 100 and accesses the NAND flash memory 100 in response to a command received from the host apparatus 300. The host apparatus 300 is, for example, a digital camera, a personal computer, and the like, and the host bus is, for example, a bus configured in accordance with an SD™ interface protocol.

Signals are transmitted through the NAND bus in accordance with a NAND interface protocol. Specific examples of the signals are an address latch enable signal ALE, a command latch enable signal CLE, a write enable signal WEn, a read enable signal REn, a ready and busy signal RBn, and an input and output signal I/O.

The signals CLE and ALE are signals notifying the NAND flash memory 100 that the input signals I/O to the NAND flash memory 100 are signals containing a command and an address, respectively. The signal WEn is a signal that is asserted at a low level and is provided to notify the NAND flash memory to accept the signal I/O as an input. The signal Ren is a signal that is also asserted at a low level and is provided to notify the NAND flash memory 100 to output data through the signal I/O. The ready and busy signal RBn is a signal indicating whether the NAND flash memory 100 is in a ready state (state that can receive a command from the controller 200) or is in a busy state (state that cannot receive the command from the controller 200), and the low level indicates the busy state. The input and output signal I/O is, for example, an 8-bit signal. The input and output signal I/O contains the data that is transmitted and received between the NAND flash memory 100 and the controller 200, and may include a command, an address, write data, read data, status information of the NAND flash memory 100, and the like.

1.1.2 Configuration of Controller 200

The configuration of the controller 200 will be described in detail with reference to FIG. 1. As illustrated in FIG. 1, the controller 200 includes a host interface circuit 210, a built-in memory (RAM) 220, a processor (CPU) 230, a buffer memory 240, and a NAND interface circuit 250.

The host interface circuit 210 is connected to the host apparatus 300 via the host bus and transfers command and data received from the host apparatus 300 to the processor 230 and the buffer memory 240, respectively. In addition, the host interface circuit 210 transfers data within the buffer memory 240 to the host apparatus 300 in response to the command of the processor 230.

The processor 230 controls the entire operation of the controller 200. For example, the processor 230 issues a write command to the NAND interface circuit 250 in response to a write command received from the host apparatus 300. The same is true when reading and erasing. In addition, the processor 230 executes various processes such as wear leveling for managing the NAND flash memory 100.

The NAND interface circuit 250 is connected to the NAND flash memory 100 via the NAND bus and performs communication with the NAND flash memory 100. The NAND interface circuit 250 outputs the signals ALE, CLE, WEn, and REn based on the command received from the processor 230 to the NAND flash memory 100. In addition, a write command issued by the processor 230 and write data within the buffer memory 240 are transferred as the input and output signal I/O to the NAND flash memory 100 during writing. Furthermore, a read command issued by the processor 230 is transferred as the input and output signal I/O to the NAND flash memory 100, and data read from the NAND flash memory 100 is received as the input and output signal I/O and transferred to the buffer memory 240.

The buffer memory 240 temporarily stores the write data or the read data.

The built-in memory 220 is, for example, a semiconductor memory such as a DRAM and is used as a work area of the processor 230. The built-in memory 220 also stores firmware for managing the NAND flash memory 100, various management tables, and the like.

1.1.3 Configuration of NAND Flash Memory 100

1.1.3.1 Entire Configuration of NAND Flash Memory 100

Next, a configuration of the NAND flash memory 100 will be described. As illustrated in FIG. 1, the NAND flash memory 100 includes a memory cell array 110, row decoders 120 (120-0 to 120-3), a sense amplifier 130, a column selector 140, a column decoder 150, an address register 160, a command register 170, and a sequencer 180.

The command register 170 temporarily stores a command CMD received from the controller 200.

The address register 160 temporarily stores an address ADD received from the controller 200, and transfers a row address RA to the row decoder 120 and transfers a column address CA to the column decoder 150.

The memory cell array 110 includes, for example, four blocks BLK (BLK0 to BLK3) that include a plurality of nonvolatile memory cells arranged in rows and columns. Then, the memory cell array 110 stores data transferred from the controller 200.

Each of row decoders 120-0 to 120-3 is provided for one of the blocks BLK0 to BLK3 and decodes the row address RA received from the address register 160. Then, the row decoders 120-0 to 120-3 output a voltage respectively to the corresponding blocks BLK0 to BLK3 based on a result of decoding of the row address RA.

The column decoder 150 decodes the column address CA received from the address register 160. Then, the column selector 140 selects a corresponding column based on a result of decoding of the column address CA in the column decoder 150.

The sense amplifier 130 senses data read from the memory cell array 110 during a reading operation. Then, the sense amplifier 130 outputs data DAT corresponding to a column selected by the column selector 140 to the controller 200. The sense amplifier 130 transfers the write data DAT received from the controller 200 to an area of the memory cell area 110 corresponding to a column selected by the column selector 140 during a writing operation.

The sequencer 180 controls an entire operation of the NAND flash memory 100 based on the command CMD stored in the command register 170.

1.1.3.2 Configuration of Block BLK

Figure 2:
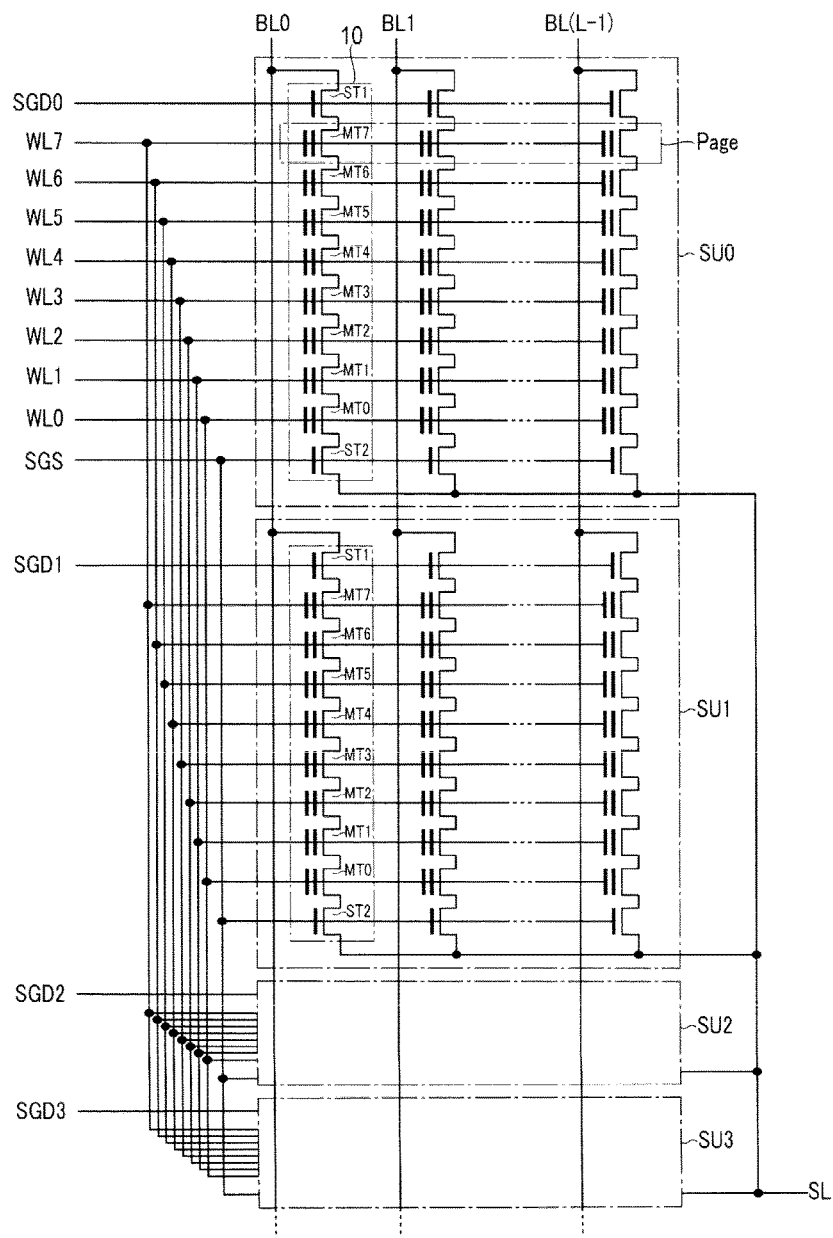
FIG. 2 is a circuit diagram of a block of memory cells included in a semiconductor memory device according to the first embodiment.

A configuration of the block BLK will be described with reference to FIG. 2. As illustrated in FIG. 2, the block BLK includes, for example, four string units SU (SU0 to SU3). In addition, each string unit SU includes a plurality of NAND strings 10.

Each NAND string 10 includes, for example, eight memory cell transistors MT (MT0 to MT7) and select transistors ST1 and ST2. The memory cell transistor MT includes a control gate and a charge storage layer, and stores data in a non-volatile manner. The memory cell transistor MT is connected between a source of the select transistor ST1 and a drain of the select transistor ST2 in series.

The gate of the select transistor ST1 is connected to each of select gate lines SGD0 to SGD3 in each of the string units SU0 to SU3. On the other hand, the gate of the select transistor ST2 in each of the string units SU0 to SU3 is, for example, commonly connected to a select gate line SGS. Of course, in alternative embodiments, the gate of the select transistor ST2 may be connected to different select gate lines SGS0 to SGS3 for each string unit. In addition, control gates of memory cell transistors MT0 to MT7 within the same block BLK are commonly connected to word lines WL0 to WL7, respectively.

In addition, the drain of the select transistor ST1 of the NAND string 10 in the same column within the memory cell array 110 is commonly connected to one of bit lines BL (BL0 to BL(L-1)) (where (L-1) is a natural number of 2 or more). That is, the bit lines BL commonly connect the NAND strings 10 across a plurality of the blocks BLK. Furthermore, the sources of a plurality of the select transistors ST2 are commonly connected to a source line SL.

That is, the string unit SU is a group of the NAND strings 10 that are connected to a different bit line BL and commonly connected to the same select gate line SGD. In addition, the block BLK is a group of the string units SU in which the word lines WL are common. The memory cell array 110 is a group of the blocks BLK in which the bit lines BL are common.

Figure 3:
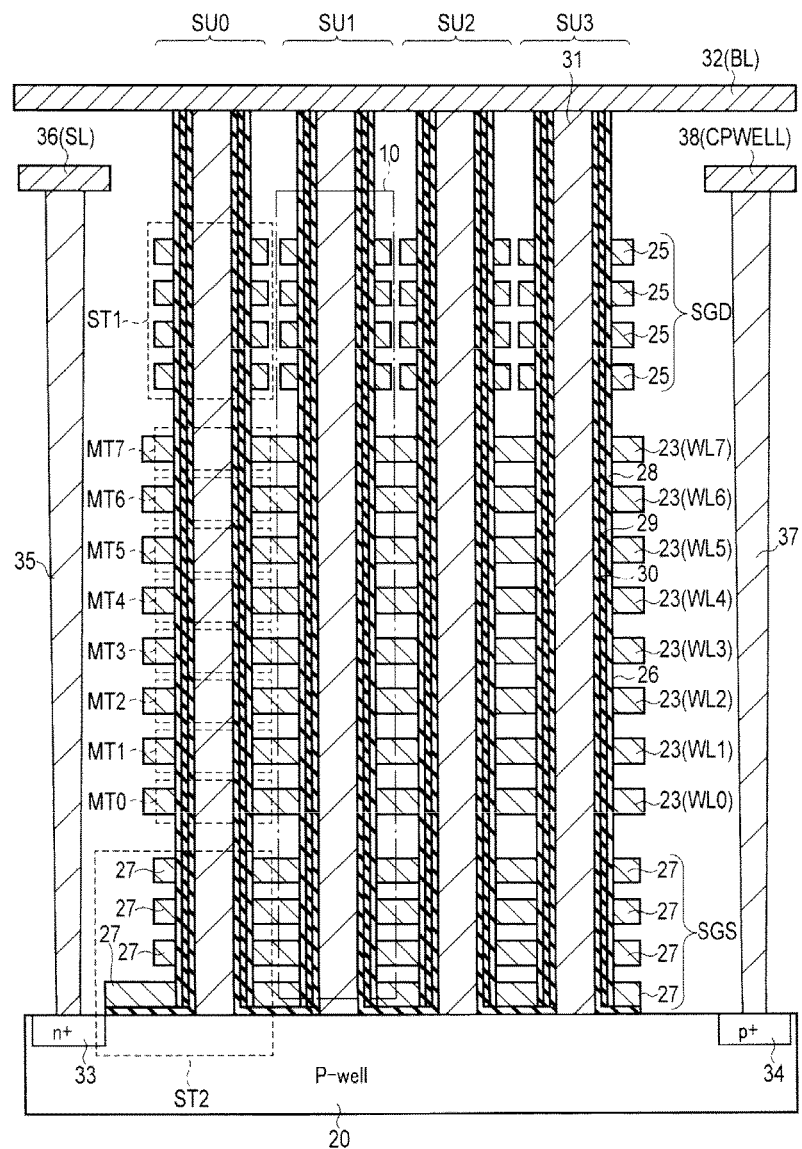
FIG. 3 is a sectional view of the block of memory cells included in the semiconductor memory device according to the first embodiment.

FIG. 3 is a sectional view of an area of a part of the block BLK. As illustrated in FIG. 3, a plurality of the NAND strings 10 are formed above a p-type well region 20. That is, for example, four layers of wiring layers 27 functioning as the select gate line SGS, eight layers of wiring layers 23 functioning as the word lines WL0 to WL7, and, for example, four layers of wiring layers 25 functioning as the select gate line SGD are sequentially stacked above the well region 20. An insulating film (not illustrated) is formed between the stacked wiring layers.

A pillar-shaped semiconductor 31 reaching the well region 20 through the wiring layers 25, 23, and 27 is formed. On a side of the semiconductor 31, a gate insulating film 30, a charge storage layer (insulating film) 29, and a block insulating film 28 are sequentially formed. As a result, the memory cell transistors MT, and the select transistors ST1 and ST2 are formed. The semiconductor 31 functions as a current path of the NAND string 10 and is a region in which a channel of each transistor is formed. The upper end of the semiconductor 31 is connected to a metal wiring layer 32 functioning as the bit line BL.

An $n^+$ type impurity diffusion layer 33 is formed within a surface region of the well region 20. A contact plug 35 is formed on the diffusion layer 33 and the contact plug 35 is connected to a metal wiring layer 36 functioning as the source line SL. Furthermore, a $p^+$ type impurity diffusion layer 34 is formed within the surface region of the well region 20. A contact plug 37 is formed on the diffusion layer 34 and the contact plug 37 is connected to a metal wiring layer 38 functioning as well wiring CPWELL. The well wiring CPWELL is wiring for applying a potential to the semiconductor 31 via the well region 20.

A plurality of structures having the above-described configurations are arranged in a depth direction of paper surface of FIG. 3 and the string unit SU is a group of the NAND strings 10 arranged in the depth direction.

In addition, erasing of data can be performed in a block BLK unit or a unit smaller than the block BLK. Such erase methods are described in "NONVOLATILE SEMICONDUCTOR MEMORY DEVICE" of U.S. patent application Ser. No. 13/235,389, filed on Sep. 18, 2011, in "NONVOLATILE SEMICONDUCTOR MEMORY DEVICE" of U.S. patent application Ser. No. 12/694,690, filed on Jan. 27, 2010, and in "NONVOLATILE SEMICONDUCTOR MEMORY DEVICE AND DATA ERASE METHOD THEREOF" of U.S. patent application Ser. No. 13/483,610, filed on May 30, 2012. All of these patent applications are incorporated by reference herein in their entirety.

Furthermore, the memory cell array 110 may have another configuration, such as the configuration of the memory cell array described in "THREE DIMENSIONAL STACKED NONVOLATILE SEMICONDUCTOR MEMORY" of U.S. patent application Ser. No. 12/407,403, filed on Mar. 19, 2009, in "THREE DIMENSIONAL STACKED NONVOLATILE SEMICONDUCTOR MEMORY" of U.S. patent application Ser. No. 12/406,524, filed on Mar. 18, 2009, in "NON-VOLATILE SEMICONDUCTOR STORAGE DEVICE AND METHOD OF MANUFACTURING THE SAME" of U.S. patent application Ser. No. 12/679,991, filed on Mar. 25, 2010, and in "SEMICONDUCTOR MEMORY AND METHOD FOR MANUFACTURING SAME" of U.S. patent application Ser. No. 12/532,030, filed on Mar. 23, 2009. All of these patent applications are incorporated by reference herein in their entirety.

1.1.3.3 Types of Block BLK and Write Unit of Data

Next, types of the block BLK and write unit of data will be described.

The block BLK according to the embodiment may be a multi-level cell (MLC) block, a single-level cell (SLC) block, or a 4 partial page program (PPP) block.

MLC Block and SLC Block

In the MLC block and the SLC block, writing of the data is simultaneously performed on the memory cell transistors MT connected to any one of the word lines WL in any one of the string units SU. This unit of writing is referred to as "page".

The SLC block is a block in which one memory cell transistor MT is capable of storing data of one bit. On the other hand, in the MLC block, one memory cell transistor MT is capable of storing data of two bits or more. For example, in a case where two-bit data is stored, writing of the data is performed for each low-order bit (lower page) and for each high-order bit (upper page) of two-bit data. Thus, the number of pages written per writing operation in the MLC block is two times the number of the pages written per writing operation in the SLC block.

4 PPP Block

Figures 4, 5:
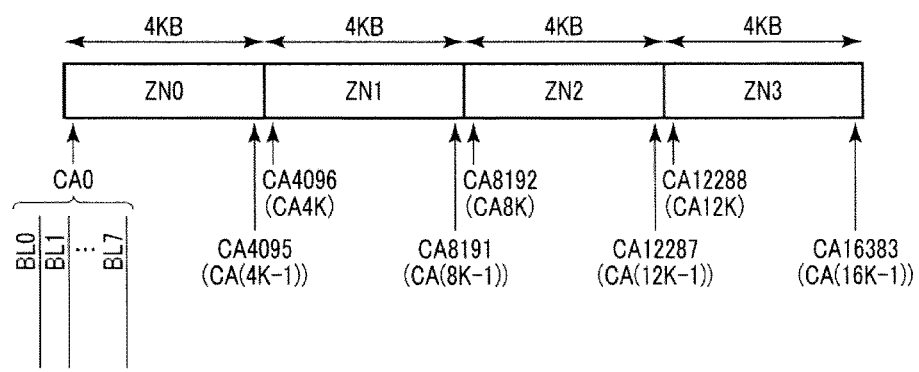
FIG. 4 is a conceptual diagram of a page of memory cells in the semiconductor memory device according to the first embodiment.
FIG. 5 is a write condition table employed in the semiconductor memory device according to the first embodiment.

The 4 PPP block is a block in which writing is performed in a unit size of ¼ of one page. FIG. 4 is a schematic diagram illustrating a relationship between one page data in the 4 PPP block and column addresses corresponding to different data positions.

The sense amplifier 130 includes a page buffer capable of storing data for one page and each bit of one page data stored in the page buffer is applied to the bit line BL during writing. Thus, FIG. 4 may be referred to as a schematic diagram of the page buffer. In addition, hereinafter, a case where the page size is 16K bytes is described as an example.

As illustrated in FIG. 4, in the 4 PPP block, one page includes four zones ZN (ZN0 to ZN3), where each zone ZN has a size of 4 KB, that is ¼ of 16 KB.

In the memory cell array 110, each of the bit lines BL is specified to correspond to a "column" unit, where one "column" includes, for example, 8 bit lines BL. For example, bit lines BL0 to BL7 correspond to a column in which the column address CA0 is specified and bit lines BL8 to BL15 correspond to a column in which the column address CA1 is specified.

In the leading zone ZN0, the leading address is CA0 and the final address is CA4095 (CA(4K−1)). In the next zone ZN1, the leading address is CA4096 (CA4K) and the final address is CA8191 (CA(8K−1)). In the next zone ZN2, the leading address is CA8192 (CA8K) and the final address is CA12287 (CA(12K−1)). Then, in the final zone ZN3, the leading address is CA12288 (CA12K) and the final address is CA16383 (CA(16K−1)).

In the 4 PPP block, data is written in a zone unit of 4 KB. In other words, writing of the data is instructed in units of the page, but data is actually written in one of selected zone and writing of the data is actually prohibited in the other, unselected zones ZN.

When writing data with respect to the 4 PPP block, write conditions are different depending on which zone ZN is selected for writing. FIG. 5 is a conceptual diagram of a table (hereinafter, referred to as a condition table) indicating a relationship between each zone ZN and the write conditions. The condition table is stored in, for example, any one of the blocks BLK, is read upon power-on to the NAND flash memory 100, and is stored in, for example, a register within the sequencer 180. Then, the sequencer executes the write operation based on the condition table.

As illustrated in FIG. 5, for each zone, the condition table holds a verify voltage VCG_Z that is used during program verify, a step-up width ΔVPGM of a program voltage VPGM that is used during program, and information about whether or not pre-verify is performed before program.

In the example of FIG. 5, when selecting the leading zone ZN0, the verify voltage that is used during program verify is VCG_Z0, the step-up width is ΔVPGM_Z0, and pre-verify is not performed. When selecting the zone ZN1, the verify voltage is VCG_Z1, the step-up width is ΔVPGM_Z1, and pre-verify may be performed or may not be performed. When selecting the zone ZN2, the verify voltage is VCG_Z2, the step-up width is ΔVPGM_Z2, and pre-verify may be performed or may not be performed. When selecting the final zone ZN3, the verify voltage is VCG_Z3, the step-up width is ΔVPGM_Z3, and pre-verify is performed.

The following relationship is satisfied in the verify level VCG_Z. That is, $$VCG\_Z0 \leq VCG\_Z1 \leq VCG\_Z2 < VCG\_Z3$$

In addition, the following relationship is satisfied in the step-up width ΔVPGM. That is, $$\Delta VPGM\_Z0 \geq \Delta VPGM\_Z1 \geq \Delta VPGM\_Z2 > \Delta VPGM\_Z3$$

Details of pre-verify will be described below.

1.2 Write Operation

Next, the write operation of the memory system 1 including the above-described configuration will be described.

1.2.1 Operation of Controller 200

First, an operation of the controller 200 will be described with reference to FIG. 6. Each step of FIG. 6 is executed under control of the processor 230.

Figure 6:
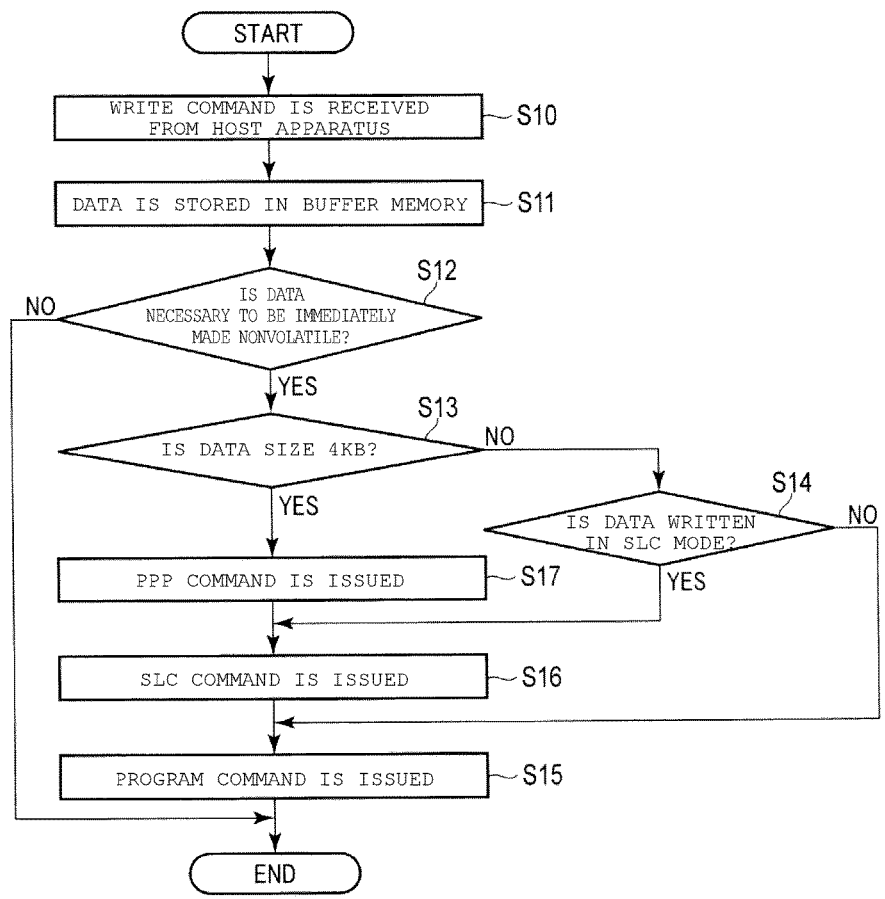
FIG. 6 is a flowchart illustrating an operation of a controller of the memory system according to the first embodiment.

As illustrated in FIG. 6, the controller 200 receives write data together with a write command from the host apparatus 300 (step S10). Then, the processor 230 causes the buffer memory 240 to store the received write data (step S11) and determines whether or not the received write data is necessary to be immediately made nonvolatile (step S12).

If it is not necessary for the received write data to be immediately made nonvolatile (step S12, NO), the process is completed. In this case, the controller 200 writes the write data to the NAND flash memory 100 at an arbitrary timing such as at a time when a write command is further received from the host apparatus 300 or during an idle time of the controller 200 and the NAND flash memory 100.

If it is necessary for the received write data to be immediately made nonvolatile (step S12, YES), the processor 230 determines a size of the write data (step S13). If the data size is not at least 4 KB (step S13, NO), the processor 230 determines whether or not data is to be written in an SLC mode (step S14). In the SLC mode data is written to the SLC block. That is, the SLC mode is a mode in which data of one bit is written to one memory cell transistor.

If writing is not necessary in the SLC mode (step S14, NO), the processor 230 selects an MLC mode. In the MLC mode, data is written to the MLC block. That is, the MLC mode is a mode in which multi-bit data is written to one memory cell transistor. Then, the NAND interface circuit 250 issues a normal program command to the NAND flash memory 100 in response to the command of the processor 230 (step S15). Subsequently, the processor 230 outputs a page address (row address) and the write data corresponding to the MLC block to the NAND flash memory 100 via the NAND interface circuit 250. The page address is an address corresponding to the next page of the page to which writing was last performed in the MLC block.

If writing is necessary in the SLC mode (step S14, YES), the processor 230 selects the SLC mode. Then, first, the NAND interface circuit 250 issues an SLC command to the NAND flash memory 100 in response to the command of the processor 230 (step S16). Sequentially, the NAND interface circuit 250 issues the normal program command (step S15). The SLC command is a command to make the NAND flash memory 100 be in the SLC mode. Subsequently, the processor 230 outputs the page address and the write data corresponding to the SLC block BLK to the NAND flash memory 100 via the NAND interface circuit 250. The page address is an address corresponding to the next page of the page to which writing was last performed in the SLC block.

In step S13, if the data size is at least 4 KB (step S13, YES), the processor 230 selects a PPP mode. As described with reference to FIG. 4, the PPP mode is a mode in which data is written in a zone unit of which a size is less than the page size, e.g., 4 KB instead of 16 KB. Then, first, in response to the command of the processor 230, the NAND interface circuit 250 issues a PPP command to the NAND flash memory 100 (step S17) and subsequently, issues the SLC command and the normal program command sequentially (steps S16 and S15). Furthermore, the processor 230 outputs the page address corresponding to the PPP block, and the column address and the write data corresponding to the selected zone to the NAND flash memory 100 via the NAND interface circuit 250. The page address is an address of the next page to the last written page in the PPP block. In addition, the column address corresponds to an address to the next zone ZN (i+1) of the last written zone ZNi in the PPP block (i is a natural number and any one of 0, 1, 2, and 3 in the example of FIG. 4). For example, in FIG. 4, if data of the zones ZN0 and ZN1 is written, CA8192 corresponding to a leading column address of the next zone ZN2 is issued.

Next, a command sequence between the controller 200 and the NAND flash memory 100 will be described.

MLC Mode

Figure 7:
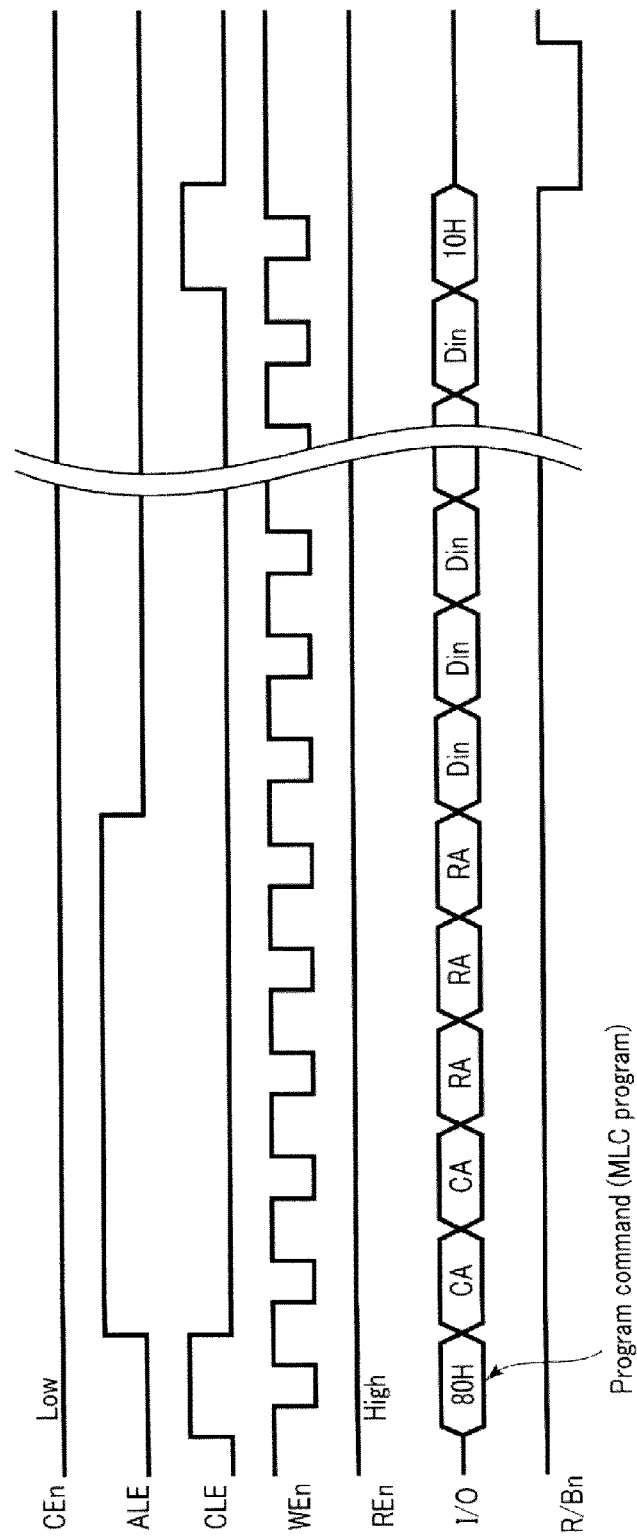
FIG. 7 is a timing chart illustrating a first command sequence of a memory system according to the first embodiment.

First, the command sequence during the MLC mode will be described with reference to FIG. 7. As illustrated in FIG. 7, first, the controller 200 issues a normal write command "80H" (corresponding to step S15 of FIG. 6) and asserts the signal CLE ("H" level). Subsequently, the controller 200 issues addresses (CA: the column address and RA: the row address) over, for example, 5 cycles and asserts the signal ALE ("H" level). The command and address are respectively stored in the registers 170 and 160. Then, the sequencer 180 recognizes that write access by the MLC mode is received because the PPP command and the SLC command are not stored but the normal write command "80H" is stored in the register 170.

Next, the controller 200 outputs write data Din over a plurality of cycles. During this period, the signals ALE and CLE are negated ("L" level). The write data Din received by the NAND flash memory 100 is stored in the page buffer within the sense amplifier 130.

Next, the controller 200 issues a write command "10H" and asserts the CLE. The sequencer 180 starts the write operation and the NAND flash memory 100 is in a busy state in response to that the command "10H" is stored in the register 170 (RBn="L"). Moreover, the controller 200 asserts WEn ("L" level) whenever signals such as a command, an address, and data are issued. Then, the signals are input into the NAND flash memory 100 whenever the WEn is toggled.

SLC Mode

Figure 8:
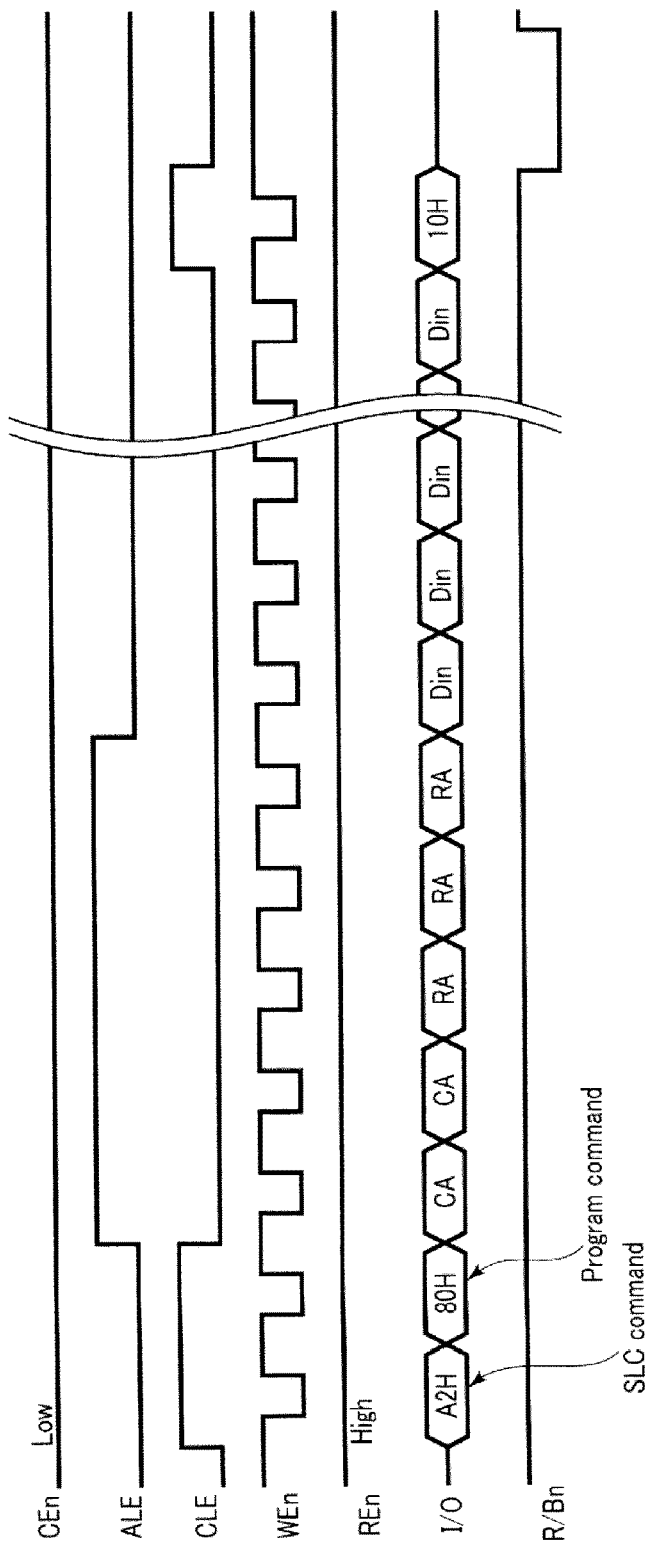
FIG. 8 is a timing chart illustrating a second command sequence of the memory system according to the first embodiment.

Next, a command sequence during an SLC mode will be described with reference to FIG. 8. As illustrated in FIG. 8, the SLC mode is different from the MLC mode described in FIG. 7 in that the controller 200 first issues an SLC command "A2H" (corresponding to step S16 of FIG. 6). Thereafter, the controller 200 issues the normal write command "80H". The PPP command is not stored and the SLC command "A2H" and the normal write command "80H" are stored in the register 170 and thereby the sequencer 180 recognizes that the write access by the SLC mode is received.

PPP Mode

Figure 9:
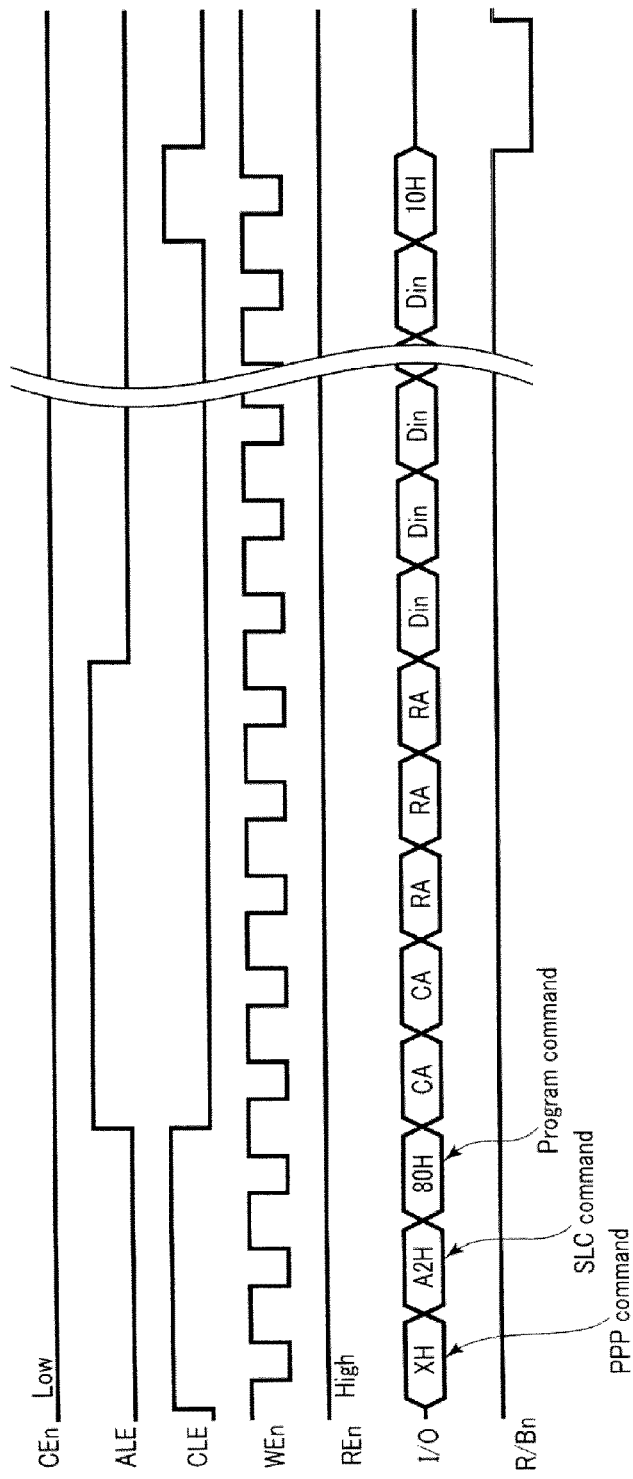
FIG. 9 is a timing chart illustrating a third command sequence of the memory system according to the first embodiment.

Next, the command sequence during the PPP mode will be described with reference to FIG. 9. As illustrated in FIG. 9, the PPP mode is different from the SLC mode described in FIG. 8 in that the controller 200 issues a PPP command "XH" before the SLC command "A2H" (corresponding to step S17 of FIG. 6). Thereafter, the controller 200 issues the SLC command "A2H" and the normal write command "80H". The PPP command "XH", the SLC command "A2H", and the normal write command "80H" are stored in the register 170, and thereby the sequencer 180 recognizes that the write access by the PPP mode is received.

1.2.2 Operation of NAND Flash Memory 100

Figure 10:
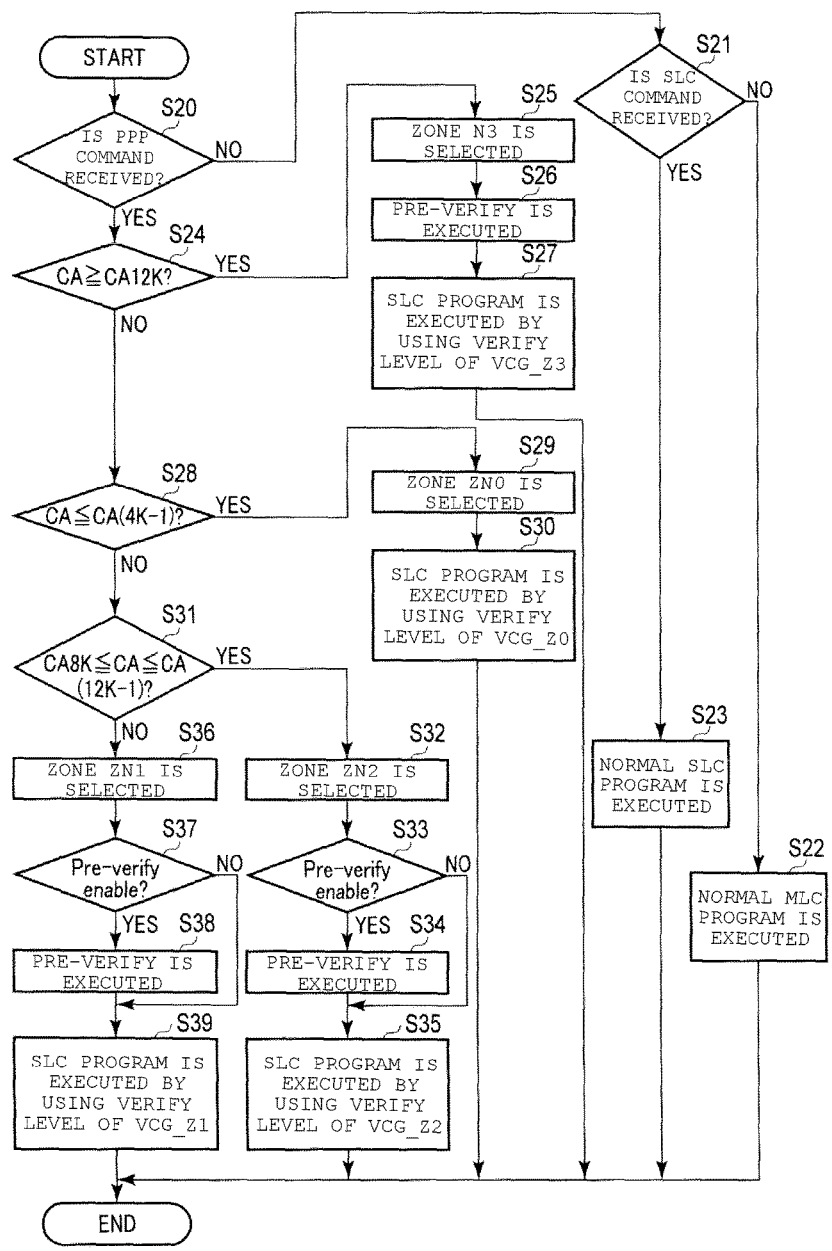
FIG. 10 is a flowchart illustrating an operation of the semiconductor memory device according to the first embodiment.

Next, an operation of the NAND flash memory 100 will be described with reference to FIG. 10. A process of FIG. 10 is started in response to that the command "10H" is stored in the command register 170 and is executed under control of the sequencer 180.

The command received from the controller 200 is stored in the command register 170 and the address is stored in the address register 160. If the PPP command is not stored (step S20, NO) and the SLC command is not stored in the command register 170 (step S21, NO), the sequencer 180 executes a program in the MLC mode (step S22). That is, if only the normal write command "80H" is applied, data is written to the MLC block in the page unit.

If the PPP command is not stored (step S20, NO), but the SLC command is stored (step S21, YES) in the command register 170, the sequencer 180 executes a program in the SLC mode (step S23). That is, if the SLC command "A2H" and the normal write command "80H" are applied, data is written to the SLC block in the page unit.

If the PPP command "XH" is stored in the command register 170 (step S20), the sequencer 180 executes a program in the PPP mode. The column decoder 150 decodes the column address CA applied from the address register 160. Then, if the column address CA is equal to or greater than CA12K (step S24, YES), the column selector 140 selects the zone ZN3 (step S25). As a result, the write data received from the controller 200 is stored in a region corresponding to the zone ZN3 in the page buffer in the sense amplifier 130. Subsequently, the sequencer 180 executes pre-verify (step S26) and executes writing by the PPP mode based on a result of pre-verify (step S27).

Figure 11:
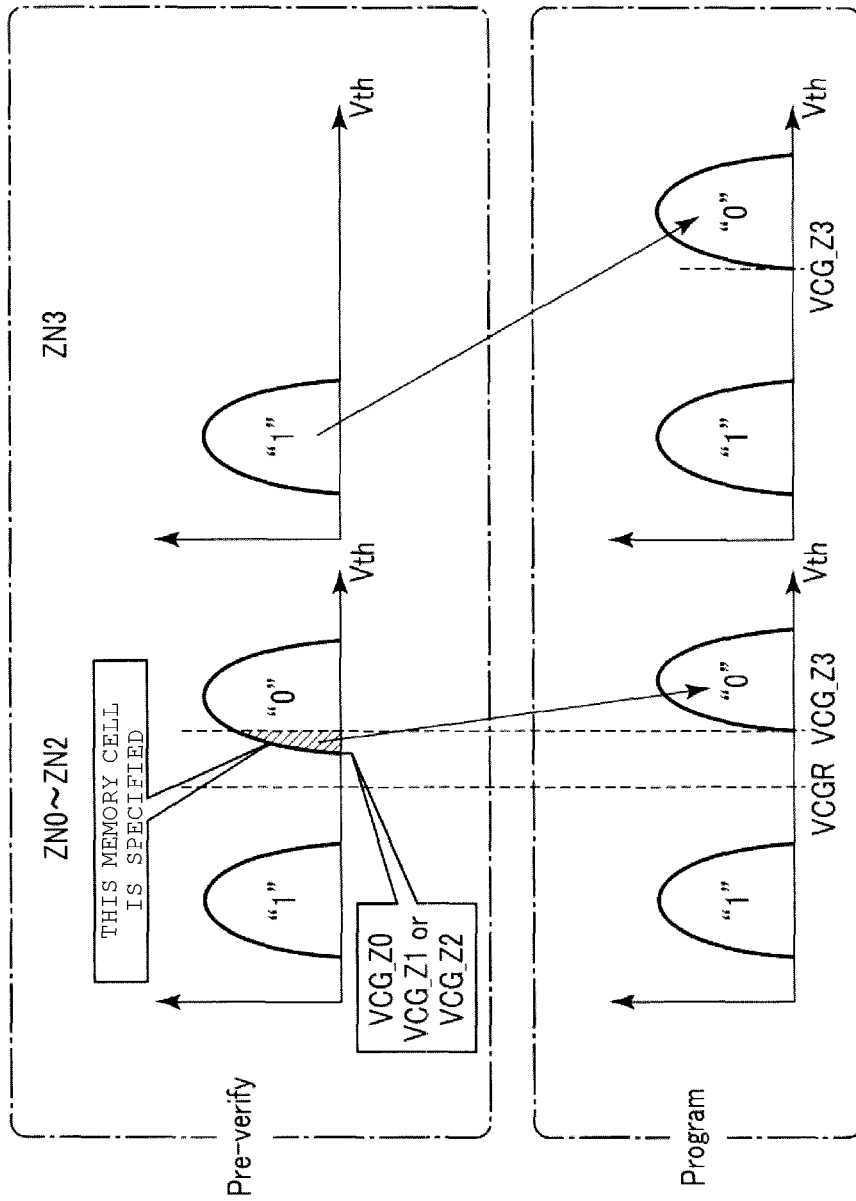
FIG. 11 is a conceptual diagram of pre-verify operation that is executed by the semiconductor memory device according to the first embodiment.

Pre-verify of step S26 and writing by the PPP mode of step S27 will be described with reference to FIG. 11. FIG. 11 illustrates a threshold voltage distribution of the memory cell transistors corresponding to the zones ZN0 to ZN2 and a threshold voltage distribution of the memory cell transistor corresponding to the zone ZN3.

As illustrated in FIG. 11, data is already written in the memory cell transistors corresponding to the zones ZN0 to ZN2 in the page when the zone ZN3 is selected. According to the example of FIG. 11, a threshold voltage of the memory cell transistor of "1" data (erased state) is, for example, a negative value. A threshold voltage of the memory cell transistor of "0" data is higher than that of "1" data (for example, a positive value). In addition, as described above with reference to FIG. 5, the verify voltages VCG_Z0, VCG_Z1, and VCG_Z2 used in the zones ZN0 to ZN2 are smaller than the verify voltage VCG_Z3 used in the zone ZN3.

In such a situation, pre-verify of step S26 is an operation to specify memory cells in zones ZN0 to ZN2 that store the "0" data and have a threshold voltage less than VCG_Z3. The distribution of the transistors that is specified as described above is indicated by a hatched region in FIG. 11.

In addition, in the program step S27, of course, the data of the zone ZN3 is written in the memory cell transistor. In this case, since the VCG_Z3 is used as the verify voltage, writing is performed on the memory cell transistor that is specified by pre-verify in addition to the memory cell transistors in zone ZN3. As a result, the threshold voltages of the memory cell transistors storing the "0" data are all equal to or greater than VCG_Z3 in all the zones ZN0 to ZN3.

The description will be continued returning to FIG. 10. If the column address CA is equal to or less than CA(4K−1) (step S28, YES), the column selector 140 selects the zone ZN0 (step S29). As a result, the write data received from the controller 200 is stored in a region corresponding to the zone ZN0 in the page buffer in the sense amplifier 130. In this case, the sequencer 180 performs writing in the SLC mode without performing pre-verify (step S30). The VCG_Z0 is used as the verify voltage. Writing to the memory cell transistors corresponding to the zones ZN1 to ZN3 is prohibited (in other words, the "1" data is programmed in zones ZN1 to ZN3).

If the column address CA is equal to or greater than CA8K and equal to or less than CA(12K−1) (step S31, YES), the column selector 140 selects the zone ZN2 (step S32). As a result, the write data received from the controller 200 is stored in a region corresponding to the zone ZN2 in the page buffer in the sense amplifier 130. Then, the sequencer 180 confirms whether or not pre-verify is enabled (step S33). If it is enabled (step S33, YES), pre-verify is performed (step S34). The memory cell transistor to be specified in pre-verify of step S34 stores the "0" data in the zones ZN0 and ZN1, and is a memory cell transistor having a threshold voltage that is less than VCG_Z2. Then, writing is executed in the memory cell transistor corresponding to the zone ZN2 in the SLC mode (step S35). Moreover, since the memory cell transistor corresponding to the zone ZN3 has to be in the erased state, writing to the memory cell transistors is prohibited. In step S33, if pre-verify is enabled (step S33, YES), in step S35, writing is executed in the memory cell transistor specified in step S33 in addition to the memory cell transistor corresponding to the zone ZN2. As a result, the threshold voltages of the memory cell transistors storing the "0" data corresponding to the page are all equal to or greater than VCG_Z2. In step S33, if pre-verify is disabled (step S33, NO), in step S35, writing to the memory cell transistors corresponding to the zones ZN0, ZN1, and zone ZN3 is prohibited.

If the column address CA is equal to or greater than CA4K and equal to or less than CA(8K−1) (step S31, NO), the column selector 140 selects the zone ZN1 (step S36). As a result, write data received from the controller 200 is stored in a region corresponding to the zone ZN1 in the page buffer in the sense amplifier 130. Then, the same process as the case where the zone ZN2 is selected is performed. That is, first, pre-verify is performed if necessary (step S38). The memory cell transistor specified by pre-verify of step S38 stores the "0" data in the zone ZN0 and is a memory cell transistor having a threshold voltage that is less than VCG_Z1. Then, writing is executed to the memory cell transistor corresponding to the zone ZN1 in the SLC mode (step S39).

Next, an operation of the NAND flash memory 100 during writing described above will be described with reference to FIGS. 12 and 13.

MLC Mode and SLC Mode

First, an operation during the MLC mode and the SLC mode will be described with reference to FIG. 12.

In the MLC mode and the SLC mode, first, a data program operation is executed. As illustrated in FIG. 12, at time t0, the row decoder 120 selects the MLC block or the SLC block and selects any one of the string units SU in a selected block in compliance with the row address RA applied from the register 160. Then, the row decoder 120 applies a voltage VSGD_prog to the select gate line SGD0 of the selected string unit SU. The voltage VSGD_grog is a voltage turning on the select transistor ST1. Furthermore, the row decoder 120 applies 0 V to the select gate line SGS and the select gate line SGD of a non-selected string unit.

In addition, the sense amplifier 130 applies, for example, 0 V to the bit line BL in which the "0" data is written and applies a positive voltage VDD (>0 V) to the bit line BL in which the "1" data is written based on the write data stored in the page buffer (time t1). Writing of the "0" data is a write operation in which a threshold voltage of the memory cell transistor MT is increased by injecting electrons into the charge storage layer of the memory cell transistor MT and, as a result, a threshold voltage level is transitioned to a higher level. On the other hand, writing of the "1" data is a write operation in which the threshold voltage level is maintained by suppressing the injection of the electrons into the charge storage layer of the memory cell transistor MT (that is, it may be said that the threshold voltage is substantially unchanged and writing is prohibited).

Subsequently, at time t2, the row decoder 120 applies a voltage VSGD (for example, VSGD_prog>VSGD) to the select gate line SGD of the select string unit SU. The voltage VSGD_prog is a voltage that is capable of transferring the voltage VDD to the select transistor ST1. On the other hand, the voltage VSGD is a voltage that is capable of transferring 0 V to the select transistor ST1, but is not capable of transferring the voltage VDD. Thus, the select transistor ST1 corresponding to the bit line BL in which the "1" data is written is in a cut-off state.

Next, at time t3, the row decoder 120 applies a voltage VPASS to the word line WL of the selected block. Subsequently, the row decoder 120 increases a voltage applied to the selected word line WL from the VPSS to the VPGM (time t4). Thus, data is written to the memory cell transistor MT connected to the selected word line WL in the select string unit SU in the page unit. The voltage VPASS is a voltage that causes the memory cell transistor MT to be a state of being turned on and a potential of the channel within the NAND string 10 corresponding to writing of the "1" data to be sufficiently increased by capacitive coupling irrespective of data stored therein. In addition, the voltage VPGM is a high voltage that is capable of injecting the electrons into the charge storage layer by FN tunneling.

In a period of times t4 to t5, after data is programmed, each wiring becomes 0 V (time t7).

Thus, if the data program is completed, the sequencer 180 executes program verify. Program verify is an operation to determine whether or not the memory cell transistor is increased to the threshold voltage level that is a target by the data program in times t4 to t5.

That is, at time t8, the row decoder 120 applies the voltage VSG to the select gate lines SGD and SGS in the select string unit SU. The voltage VSG is a voltage in which the select transistors ST1 and ST2 are in a state of being turned on. Subsequently, the sense amplifier 130 applies a voltage Vb1 (<VDD) to the bit line BL and the row decoder 120 applies a voltage VREAD to a non-selected word line WL of the selected block. The voltage VREAD is a voltage in which the memory cell transistor is in the state of being turned on irrespective of data stored therein (time t9). Furthermore, the row decoder 120 applies a program verify voltage Vpvfy to the selected word line WL (time t10). In the example of FIG. 5, the Vpvfy is equal to the VCG_Z3 and is a threshold voltage to be final target in the memory cell transistor.

As a result, if the memory cell transistor connected to the selected word line WL is in the state of being turned off, a cell current does not flow through the bit line BL and the bit line BL passes program verify. On the other hand, if the memory cell transistor is in the state of being turned on, the cell current flows through the bit line BL and the bit line BL fails program verify.

Hereinafter, the program and the program verify are repeated for the bit line BL that failed the program verify. In this case, the value of the voltage VPGM is stepped up by ΔVPGM when the program is repeated.

Figure 12:
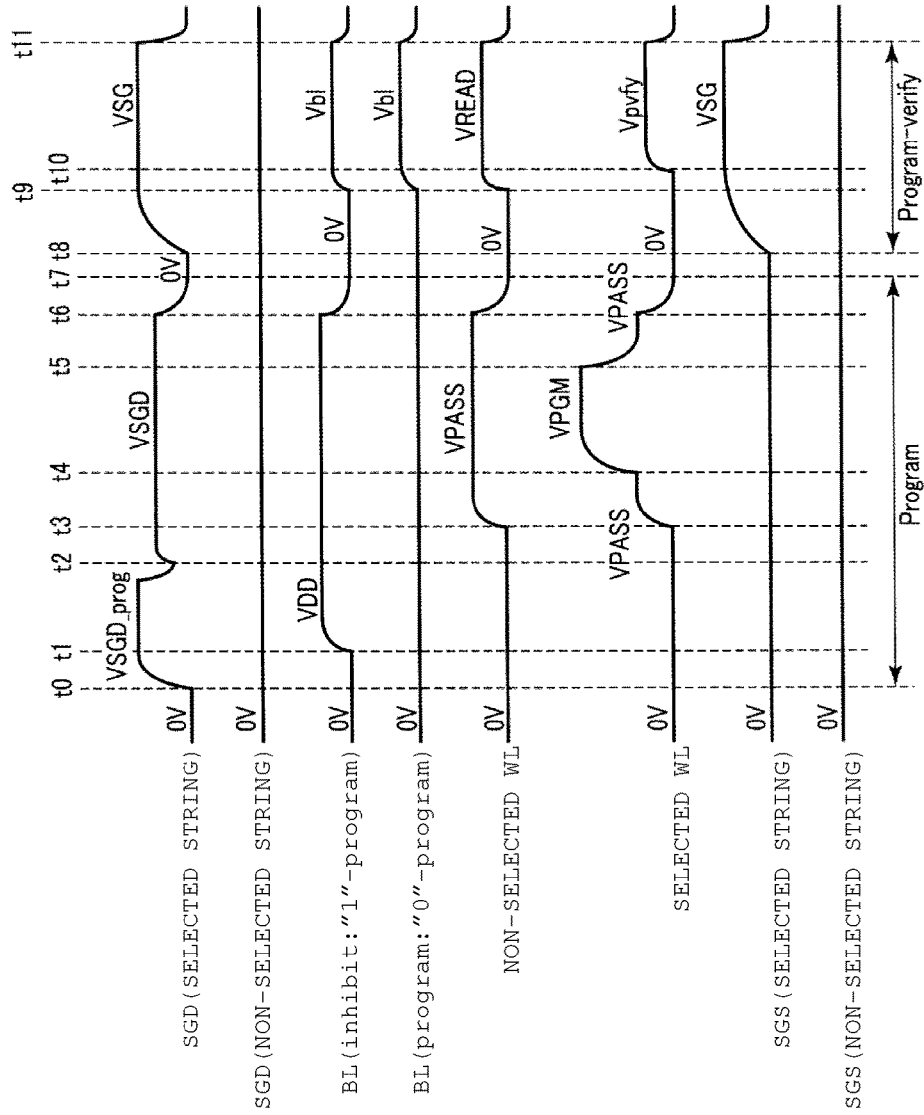
FIG. 12 is a timing chart illustrating voltage changes of various signals during a write operation in first or second mode of the semiconductor memory device according to the first embodiment.

Moreover, in the example of FIG. 12, the program verify voltage Vpvfy is a constant value, but in a case of the MLC mode, the Vpvfy is also stepped up in accordance with the threshold voltage.

PPP Mode

Next, an operation during the PPP mode will be described with reference to FIG. 13. Hereinafter, differences from the MLC mode and the SLC mode described in FIG. 12 will be described.

In the PPP mode, first, the sequencer 180 executes pre-verify in a period of times t20 to t0 before the data program.

Figure 13:
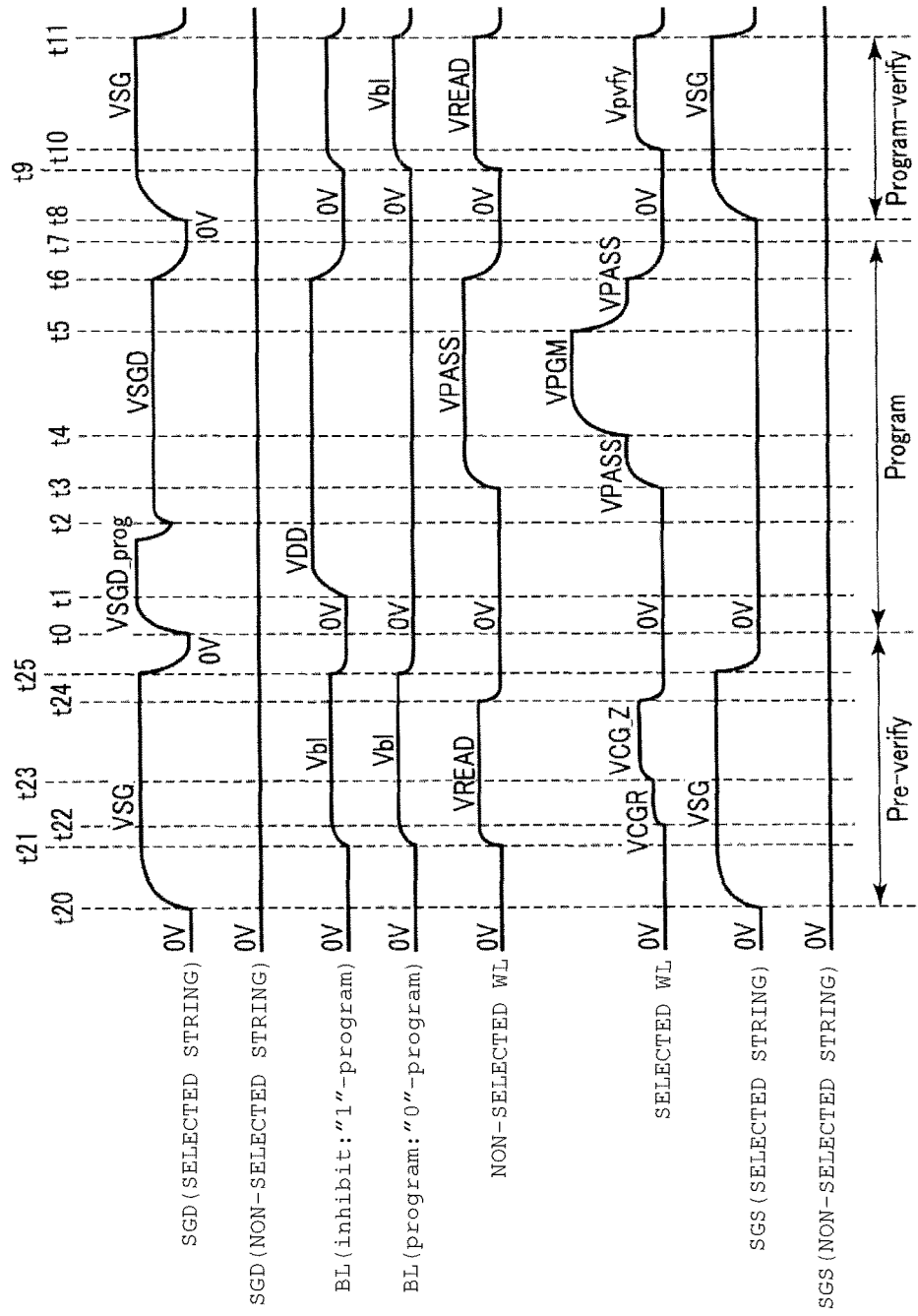
FIG. 13 is a timing chart illustrating voltage changes of various signals during the write operation in a third mode of the semiconductor memory device according to the first embodiment.

As illustrated in FIG. 13, first, similar to during the program verify, the row decoder 120 applies the voltage VSG to the select gate lines SGD and SGS of the select string unit SU, and causes the select transistors ST1 and ST2 to be in the state of being turned on (time t20). Subsequently, at time t21, the sense amplifier 130 charges the voltage Vb1 to the bit line BL and the row decoder 120 applies the voltage VREAD to the non-selected word line WL. In this state, the row decoder 120 applies a voltage VCGR to the selected word line WL at time t22. As illustrated in FIG. 11, the voltage VCGR is a voltage that is capable of determining the "1" data and the "0" data, a value thereof is less than the VCG_Z0, and the voltage VCGR is greater than a maximum value of an obtained threshold voltage of the memory cell transistor storing the "1" data.

Subsequently, the row decoder 120 applies the verify voltage VCG_Z to the selected word line WL at time t23. As illustrated in FIG. 5, the verify voltage VCG_Z is a value set for each zone.

As a result, it is possible to specify that the bit line, in which the cell current does not flows during application of the voltage VCGR and the cell current flows during application of the verify voltage VCG_Z, corresponds to the memory cell transistor which holds the "0" data and of which the threshold voltage is less than the VCG_Z (that is, a memory cell of a hatched portion in FIG. 11 is specified).

After pre-verify described above, the program and the program verify are repeated. Differences of the program in the PPP mode from the MLC mode and the SLC mode are that the bit line BL that is specified during pre-verify is also a target of writing of the "0" data. That is, also in the unselected zone ZN, 0 V is applied to the bit line BL which is specified in pre-verify.

The program verify is the same as the MLC mode and the SLC mode. However, the verify voltage used during the program verify has the same value as the verify voltage VCG_Z that is used during pre-verify.

As described above, the "0" data is stored and the bit line BL corresponding to the memory cell transistor of which the threshold voltage is less than the VCG_Z is specified by a read operation twice using the voltages VCGR and VCG_Z. Such a memory cell transistor described above is a memory cell transistor in which, the verify voltage used during writing of the "0" data is less than the VCG_Z, or the threshold voltage immediately after writing is equal to or greater than the VCG_Z, but the threshold voltage decreased after elapse of time. Then, additional writing of the "0" data is also performed on such a memory cell transistor.

Moreover, pre-verify may be performed only at beginning of the write operation. Thereafter, the program operation and the program verify operation are repeated similar to the MLC mode and the SLC mode.

1.2.3 Specific Example of PPP Mode

Figure 14:
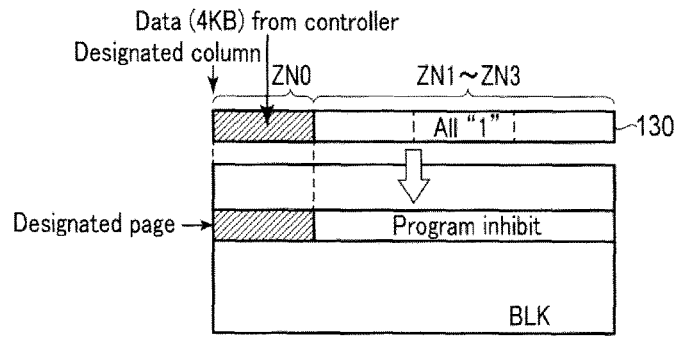
FIG. 14 is a schematic diagram of a first part of the write operation in the third mode of the semiconductor memory device according to the first embodiment.
Figure 15:
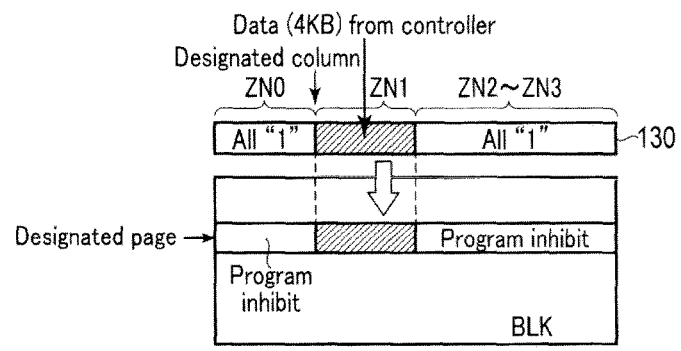
FIG. 15 is a schematic diagram of a second part of the write operation in the third mode of the semiconductor memory device according to the first embodiment.
Figure 16:
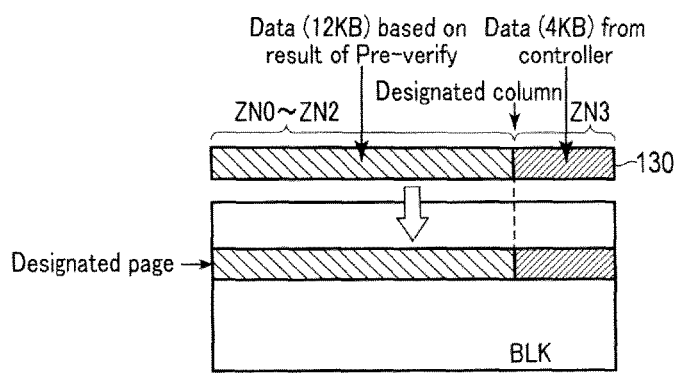
FIG. 16 is a schematic diagram of a final part of the write operation in the third mode of the semiconductor memory device according to the first embodiment.

Next, a specific example of the write operation of data by the PPP mode will be described with reference to FIGS. 14 to 16. FIGS. 14 to 16 are schematic diagrams of the sense amplifier 130 and the PPP block. In FIGS. 14 to 16, a page size is 16K bytes, 1 page includes 4 zones, and states are illustrated when the zones ZN0, ZN1, and ZN3 are respectively selected.

First, a state when selecting the zone ZN0 will be described with reference to FIG. 14. As illustrated in FIG. 14, data of 4K bytes applied from the controller 200 is stored in a region corresponding to the zone ZN0 selected by the column selector 140 in the page buffer of the sense amplifier 130. In the other regions (zones ZN1 to ZN3), for example, all bits are set to be "1" by the sequencer 180. In this state, data is written in the page unit. As a result, writing is substantially performed only in the zone ZN0 and writing is not performed in the zones ZN1 to ZN3.

Next, a state when selecting the zone ZN1 will be described with reference to FIG. 15. FIG. 15 illustrates a case where pre-verify during selecting the zone ZN1 is disabled. As illustrated in FIG. 15, data of 4K bytes applied from the controller 200 is stored in a region corresponding to the zone ZN1 selected by the column selector 140 in the page buffer of the sense amplifier 130. In the other regions (zones ZN0 and ZN2 to ZN3), for example, all bits are set to be "1" by the sequencer 180. In this state, data is written in the page unit. As a result, writing is substantially performed only in the zone ZN1 and writing is not performed in the zones ZN0 and ZN2 to ZN3. Moreover, if pre-verify is enabled, the "0" data is also written to the memory cell transistor in which additional writing is necessary based on a result of pre-verify using the verify voltage VCG_Z1. A state when selecting the zone ZN2 is similar to the one described with reference to FIG. 15.

Next, a state when selecting the zone ZN3 will be described with reference to FIG. 16. When selecting the final zone ZN3, first, pre-verify is performed using the verify voltage VCG_Z3. Then, as illustrated in FIG. 16, data based on a result of pre-verify is stored in the page buffer of the sense amplifier 130. That is, "0" is set in a region corresponding to the memory cell transistor MT in which additional writing is necessary and "1" is set in a region in which additional writing is not necessary. Furthermore, data of 4K bytes applied from the controller 200 is stored in a region corresponding to the zone ZN3 selected by the column selector 140. In this state, data is written in page unit. As a result, additional writing in accordance with the pre-verify result is also performed in the zones ZN0 to ZN2 in which writing is already completed in addition to the zone ZN3.

1.3 Effects of Embodiment

According to the embodiment, it is possible to improve operation reliability of the memory system and the semiconductor memory device. The effect of the embodiment will be described below.

The controller of the memory device manages the memory device using, for example, various file systems such as a file allocation table (FAT) file system. In addition, data that is to be written to the memory device is data to be immediately made nonvolatile (to be written to the nonvolatile memory cell) and data that is not so. In a case of latter data, for example, it may be made nonvolatile at a convenient timing such as idle time of the controller and the memory device.

Examples of data to be immediately made nonvolatile include management information of the file system, and a size of such data is often smaller than the page size. In this case, 1 page is divided into a plurality of regions and it is preferable that writing is performed in data unit less than the page size. More specifically, page data, which includes substantial data only on part of the region and includes write prohibition data ("1" data in the example) in the other regions, may be written. Then, when writing the next data including a size less than the page size, the same page is selected and substantial data is written in the region in which the "1" data is written. It is possible to effectively use the page by using this method.

However, according to this method, influence of program disturbance is different between data that is initially written and data that is initially written within the same page. That is, the data that is not finally written is affected by a write operation that is performed thereafter within the same page and the threshold voltage distribution thereof spreads. As a result, there is a concern that reliability of the data is decreased.

In this regard, according to the embodiment, the controller 200 issues the PPP command designating the PPP mode to the NAND flash memory 100. Then, the NAND flash memory 100 recognizes that the data of a size less than the page size is to be written by receiving the PPP command. Then, the NAND flash memory 100 determines whether the data to be written corresponds to any one of regions (any one of the zones ZN0 to ZN3 in the above-described embodiment) within the page based on the column address received from the controller 200. Then, if the data corresponds to the region in which writing is finally performed within the page, writing is executed in the page unit and the writing is also performed in zones in which writing is already performed such that the threshold voltage distribution within the page is aligned. Thus, even if writing is performed in the data unit of a size less than the page size, it is possible to suppress a decrease in data reliability.

Figure 17:
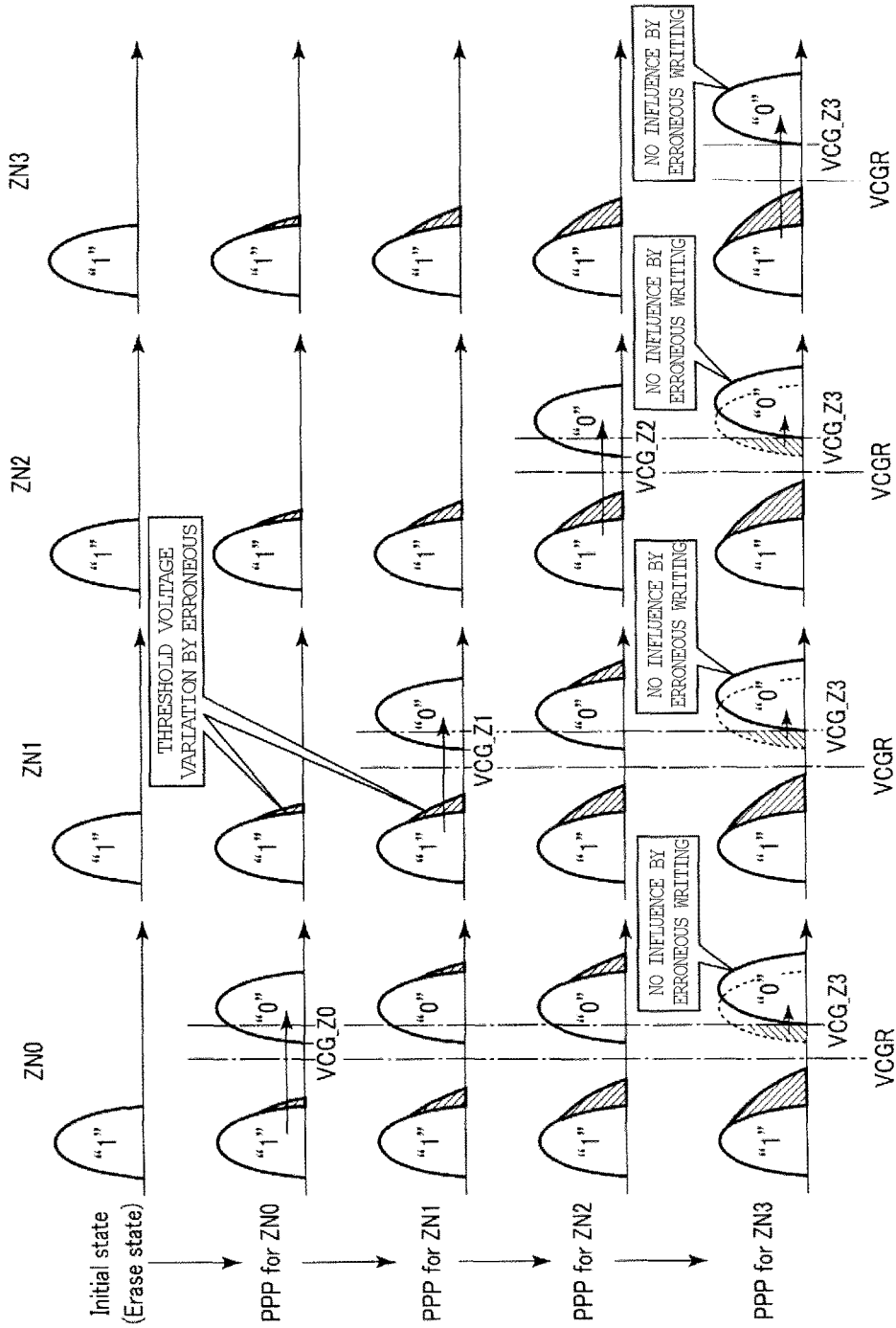
FIG. 17 is a schematic diagram illustrating changes in a threshold voltage distribution of memory cells different zones of the semiconductor memory device according to the first embodiment.

The configuration described above will be described in detail with reference to FIG. 17. FIG. 17 illustrates a variation of the threshold voltage distribution of the memory cell transistors corresponding to the zones ZN0 to ZN3 when data is written to the zone ZN0, ZN1, ZN2, and ZN3 in this order for a certain page. In addition, FIG. 17 illustrates a case where pre-verify is not performed in the zones ZN1 and ZN2.

As illustrated in FIG. 17, all the memory cell transistors hold the "1" data and the threshold voltage thereof is less than the VCGR (for example, less than 0 V) in the initial state (erased state).

In this state, first, the zone ZN0 is written in the PPP mode. As a result, the "0" data is written in a part of the memory cell transistor corresponding to the zone ZN0 in compliance with the write data. The threshold voltage of the memory cell transistor storing the "0" data is equal to or greater than the VCG_Z0 and, of course, is higher than the VCGR. On the other hand, erroneous writing occurs in the memory cell transistor of the object to be not written (writing of the "1" data) and the threshold voltage of the memory cell transistor of a part of the object to be not written is also varied by applying the voltage VPGM to the selected word line WL. As a result, an upper portion of the threshold voltage distribution is shifted on a high voltage side. The portion of threshold voltage shift is indicated by hatched lines in FIG. 17.

Next, the zone ZN1 is written in the PPP mode. As a result, the "0" data is written to a part of the memory cell transistor corresponding to the zone ZN1. The threshold voltage of the memory cell transistor storing the "0" data is equal to or greater than the VCG_Z1 and is higher than the VCGR. A series of in this case, the threshold voltage of the memory cell transistor of the object to be not written is also varied by erroneous writing. Furthermore, the threshold voltage of the memory cell transistor in the memory cell transistors corresponding to the zone ZN0 in which writing is already completed, in which the "0" data is written, is also varied.

Subsequently, the zone ZN2 is written in the PPP mode. Also in this case, similar to the zone ZN1, the threshold voltage of the memory cell transistor of the object to be not written is varied by erroneous writing.

Finally, the zone ZN3 is written in the PPP mode. In this case, writing is also performed on the memory cell transistors corresponding to the zones ZN0 to ZN2 which are determined additional writing is necessary by a pre-verify result using the verify voltage VCG_Z3.

As a result, when writing of the zone ZN3 is completed, that is, when writing is completed for the entire page, the influence of erroneous writing is substantially eliminated in the threshold voltage distribution of the memory cell transistors storing the "0" data. That is, the influence of erroneous writing received by the zones ZN0 to ZN3 is different for each zone. However, an error of the influence is substantially eliminated and the threshold voltage distribution of the memory cell transistors storing the "0" data is substantially uniform between the zones ZN0 to ZN3 by performing writing of the zone ZN3 based on the pre-verify result. On the other hand, in the threshold voltage distribution of the "1" data, the influence of erroneous writing remains in the memory cell transistor of the object to be not written, but a shift amount of the threshold voltage due to the influence is substantially the same among the zones ZN0 to ZN3. This is because the number of times of the influence of erroneous writing that is received by the memory cell transistor of the object to be not written is the same (e.g., 4 times) for all of the zones ZN0 to ZN3. Thus, the threshold voltage distribution of the "1" data is also substantially uniform among the zones ZN0 to ZN3.

As described above, in divided writing in which writing is performed by dividing 1 page into a plurality of regions, the NAND flash memory 100 recognizes whether the write data corresponds to any one of regions within 1 page. Then, pre-verify is performed at least during writing of the final zone ZN3, and writing is performed again in the zones ZN0 to ZN2 in which writing is already performed, based on the result, and the threshold voltage distribution of the regions is adjusted to be uniform with that of the zone ZN3. Thus, even if divided writing is performed, it is possible to substantially uniformly align the threshold voltage distribution in the zones.

Figure 18:
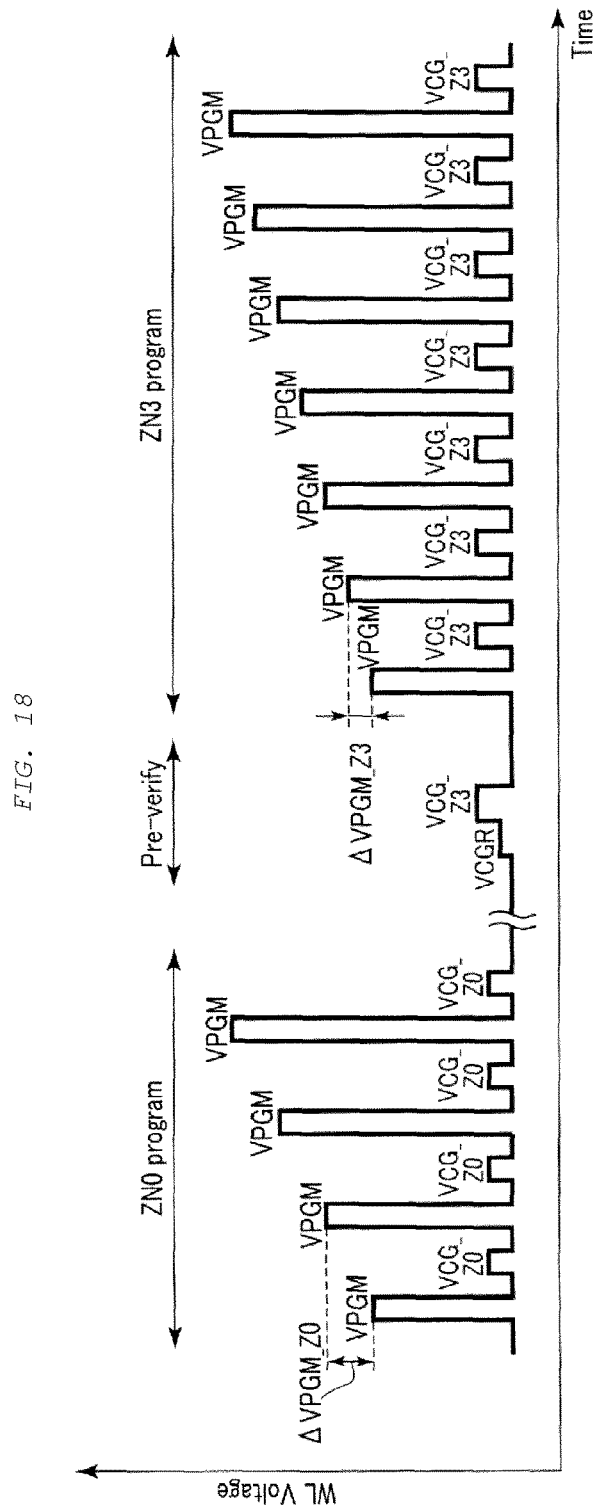
FIG. 18 is a timing chart illustrating changes in a word line voltage of the semiconductor memory device according to the first embodiment.

Moreover, the threshold voltage distribution of the memory cell transistors corresponding to the zones other than the final zone is adjusted during writing the final zone. Thus, writing in zones other than the final zone may be rougher compared to writing of the final zone. This point will be described with reference to FIG. 18. FIG. 18 is a time chart simplifying and illustrating a voltage of a word line during writing in the zone ZN0, pre-verify, and writing in the zone ZN3.

As illustrated in FIG. 18, data is written by repeating program and the program verify. In this case, the program voltage VPGM is stepped up by the step-up width ΔVPGM whenever repeating. Then, a step-up width ΔVPGM_Z0 during writing the leading zone ZN0 is greater than a step-up width ΔVPGM_Z3 during writing the final zone ZN3. Thus, writing of the zone ZN0 is completed earlier than writing of the zone ZN3. On the other hand, since the program voltage VPGM is stepped up in a fine step during writing the zone ZN3, it is possible to set the threshold voltage with a higher accuracy when writing the zone ZN3. Writing in the zones ZN1 and ZN2 may be carried out with the larger step-up width ΔVPGM_Z0.

Moreover, in FIG. 18, an initial value of the program voltage VPGM is the same value in the case of writing the zone ZN0 and a case of writing the zone ZN3, but different values may be used.

2. Second Embodiment

Next, a memory system according to a second embodiment will be described. The embodiment further includes a writing mode that is performed by dividing 1 page into two parts in the first embodiment described above. Only differences from the first embodiment will be described below. Hereinafter, a writing mode (mode described in the first embodiment) that is performed by dividing 1 page into 4 parts is referred to as a 4 PPP mode and a writing mode that is performed by dividing 1 page into two parts is referred to as a 2 PPP mode.

2.1 Types of Block and Wiring Unit of Data

A memory cell array 110 according to the embodiment further includes a 2 PPP block in addition to the MLC block, the SLC block, and the 4 PPP block described in the first embodiment.

Figures 19, 20:
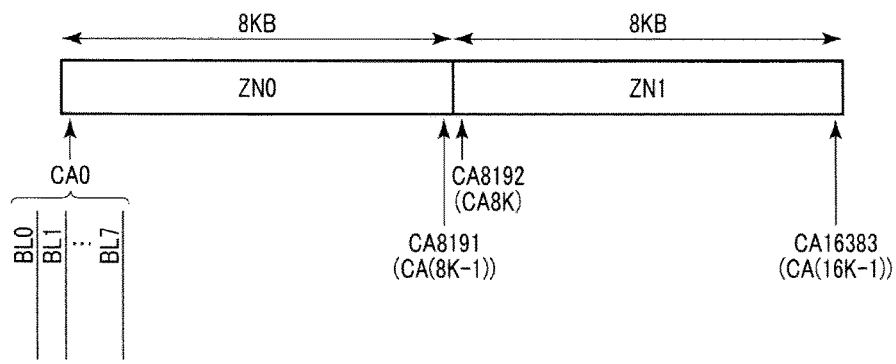
FIG. 19 is a conceptual diagram of a page of memory cells in a semiconductor memory device according to a second embodiment.
FIG. 20 is a condition table employed in the semiconductor memory device according to the second embodiment.

The 2 PPP block is a block in which writing is performed in data unit of ½ size of 1 page. FIG. 19 is a schematic diagram illustrating a relationship of 1 page data and a column address corresponding to a data position in the 2 PPP block, and corresponds to FIG. 4 in which the 4 PPP block is described.

As illustrated in FIG. 19, 1 page in the 2 PPP block includes two zones ZN0 and ZN1. Then, each zone ZN includes a size of 8 KB that is ½ of 16 KB.

In the leading zone ZN0, the leading address is CA0 and the final address is CA8191 (CA(8K−1)). In the next zone ZN1, the leading address is CA8192 (CA8K) and the final address is CA16383 (CA(16K−1)). Then, in the 2 PPP block, data is written in the zone ZN unit of 8 KB.

Write conditions in the 2 PPP mode are stored in the condition table described with reference to FIG. 5 in the first embodiment. FIG. 20 is a conceptual diagram of a condition table according to the embodiment.

As illustrated in FIG. 20, the write conditions during selecting the leading zone ZN0 are the same as those during selecting the leading zone ZN0 in the 4 PPP mode. In addition, the write conditions during selecting the final zone ZN1 are the same as those during selecting the final zone ZN3 in the 4 PPP mode.

2.2 Write Operation

Next, a write operation in a memory system 1 according to the embodiment will be described.

2.2.1 Operation of Controller 200

Figure 21:
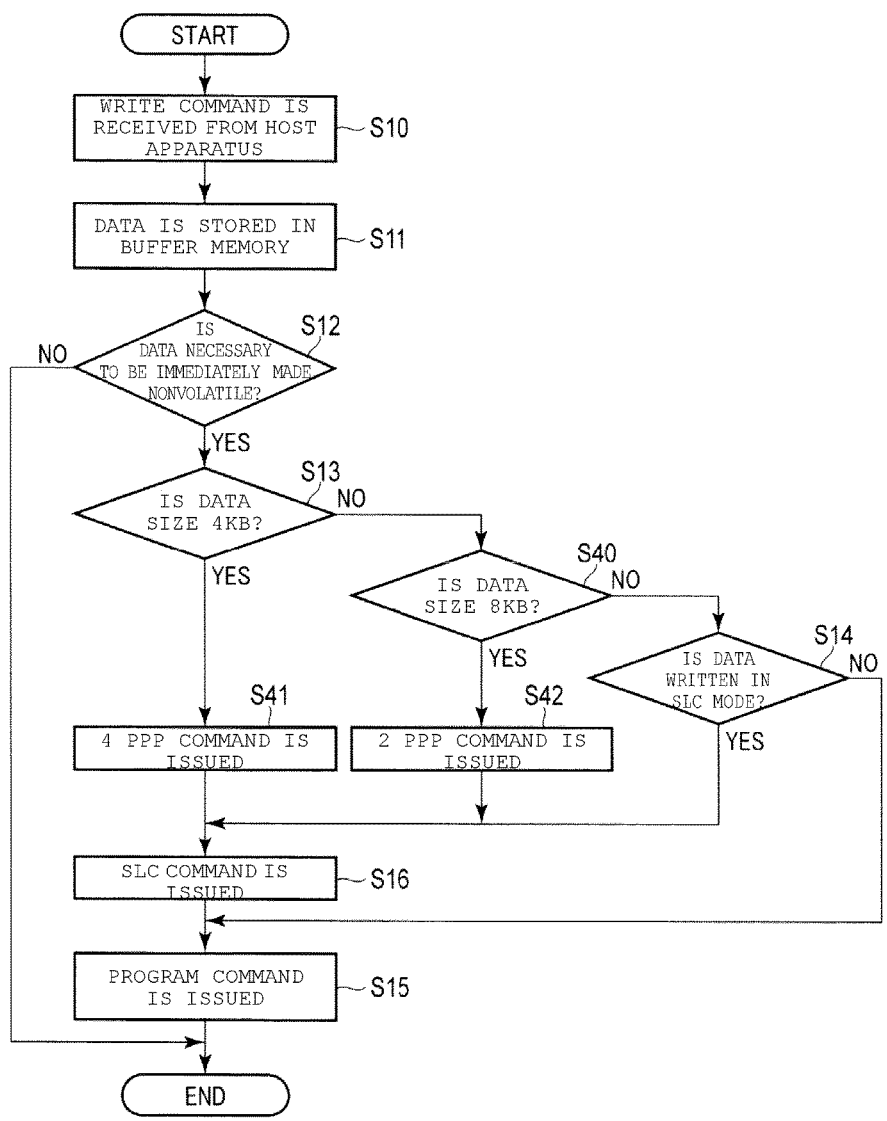
FIG. 21 is a flowchart illustrating an operation of a controller according to the second embodiment.

First, an operation of the controller 200 will be described with reference to FIG. 21. FIG. 21 is a flowchart illustrating the operation of the controller 200 during the write operation.

Differences from the operation described with reference to FIG. 6 in the first embodiment are the following points. That is, (1) If the data size is 4 KB (step S13, YES), the controller 200 issues a 4 PPP command (step S41).

(2) If the data size is 8 KB (step S40, YES), the controller 200 issues a 2 PPP command (step S42).

The 4 PPP command and the 2 PPP command are a type of the PPP command described in the first embodiment, and are respectively commands for commanding writing in the 4 PPP mode and the 2 PPP mode.

Figure 22:
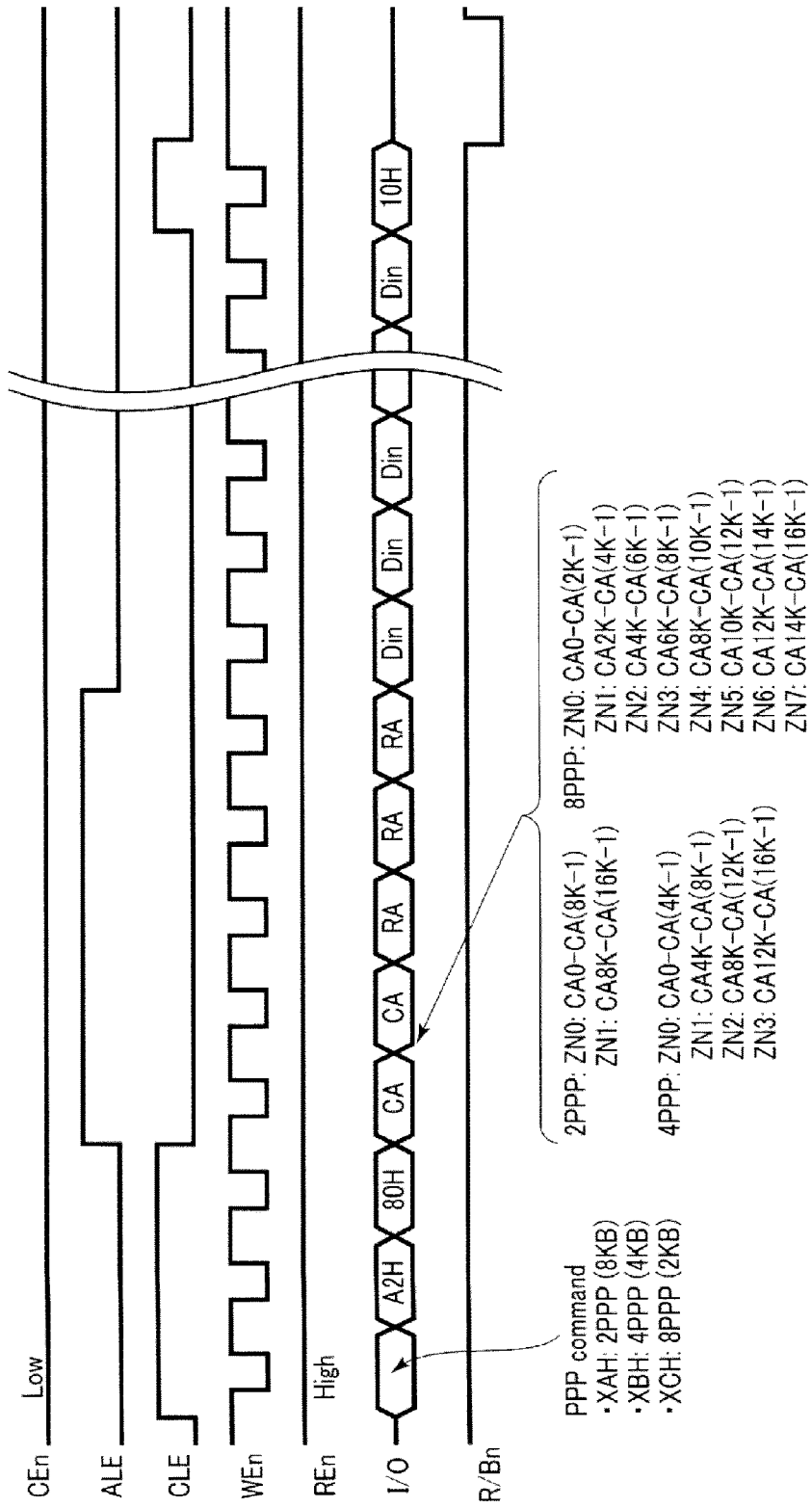
FIG. 22 is a timing chart illustrating a command sequence of a memory system according to the second embodiment.

FIG. 22 illustrates a command sequence in the PPP mode. As illustrated in FIG. 22, a difference from FIG. 9 described in the first embodiment is that a plurality of the PPP commands are available. According to the example of FIG. 22, when the 2 PPP mode is designated, a command "XAH" is issued and when the 4 PPP mode is designated, a command "XBH" is issued. Moreover, 1 page may be divided into 8 parts and a 8 PPP mode in which data is written in 2 KB unit may be prepared. In this case, a command "XCH" is issued.

2.2.2 Operation of NAND Flash Memory 100

Figure 23:
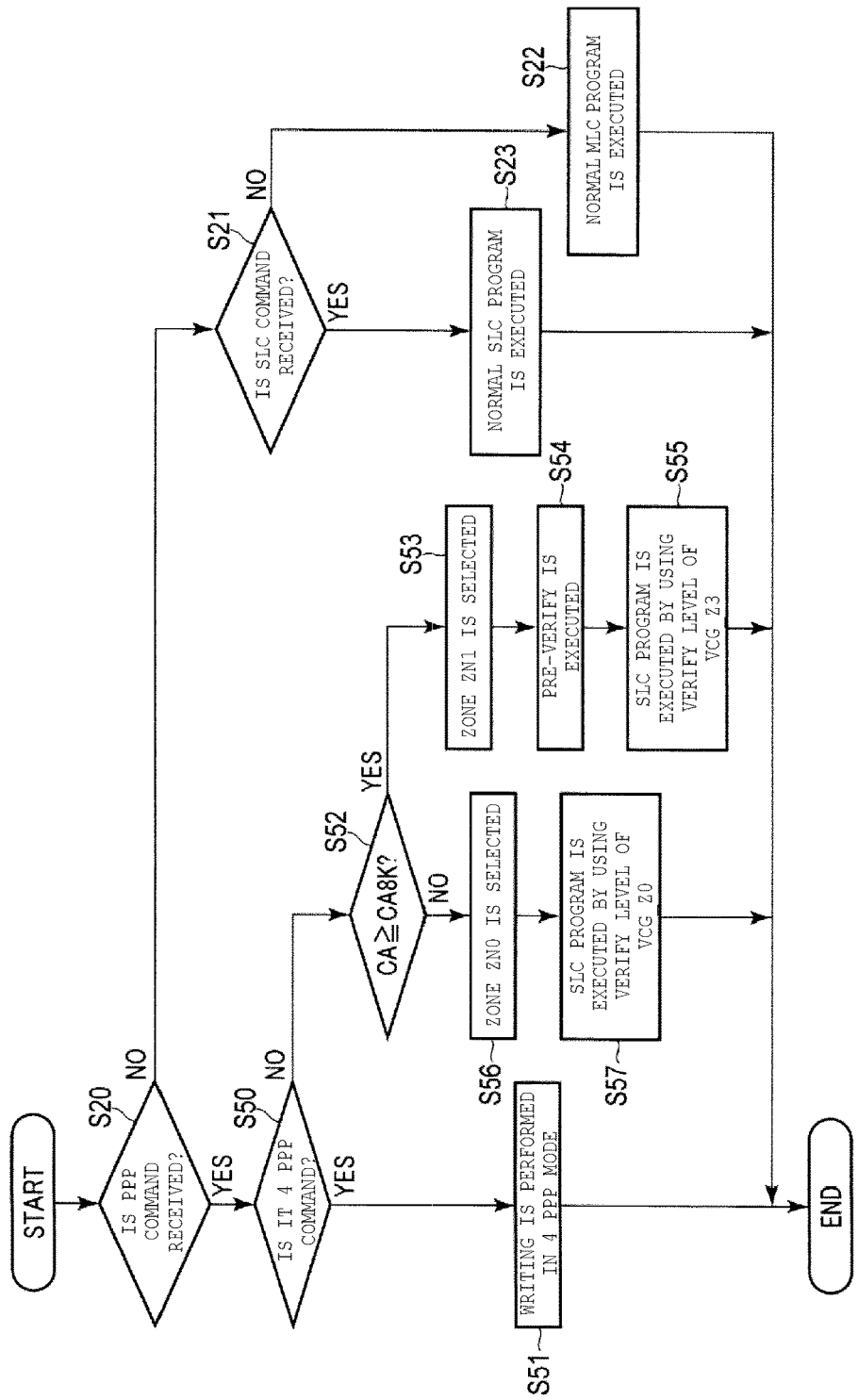
FIG. 23 is a flowchart illustrating an operation of the semiconductor memory device according to the second embodiment.

Next, an operation of the NAND flash memory 100 will be described with reference to FIG. 23. FIG. 23 is a flowchart illustrating the operation of the NAND flash memory 100 in the write operation and corresponds to FIG. 10 in the first embodiment.

As illustrated in FIG. 23, the PPP command is received (step S20, YES) and if the PPP command is the 4 PPP command (step S50, YES), the sequencer 180 performs writing in the 4 PPP mode. This operation is the same as the description in the first embodiment and the operation of steps S24 to S39 is performed in FIG. 10.

If the received PPP command is the 2 PPP command (step S50, NO), the sequencer 180 performs writing in the 2 PPP mode. If the column address CA is equal to or greater than CASK (step S52, YES), the column selector 140 selects the zone ZN1 (step S53). As a result, the write data of 8K bytes received from the controller 200 is stored in a region corresponding to the zone ZN1 in the page buffer in the sense amplifier 130. Subsequently, the sequencer 180 performs pre-verify (step S54) and writing is performed by the SLC mode based on a result of pre-verify (step S55). That is, the same operation as when selecting the zone ZN3 in the 4 PPP mode is performed.

If the column address CA is equal to or less than CA(8K−1) (step S52, NO), the column selector 140 selects the zone ZN0 (step S56). As a result, the write data of 8 KB received from the controller 200 is stored in a region corresponding to the zone ZN0 in the page buffer in the sense amplifier 130. If the zone ZN0 is selected, the sequencer 180 performs writing in the SLC mode without performing pre-verify (step S57). That is, the same operation as when selecting the zone ZN0 in the 4 PPP mode is performed.

2.3 Effects of Embodiment

According to the embodiment, it is possible to correspond to data of various sizes by including a plurality of the PPP modes. In the embodiment, the case in which data is 4 KB and 8 KB is described as an example, but is not limited, and it is possible to appropriately select various data sizes.

3. Third Embodiment

Next, a memory system of a third embodiment will be described. In the embodiment, a controller 200 notifies the number of zones and a selected zone within 1 page to the NAND flash memory 100 in the first or second embodiment described above. Hereinafter, only differences from the first and second embodiments will be described.

3.1 Operation of Controller 200

Figure 24:
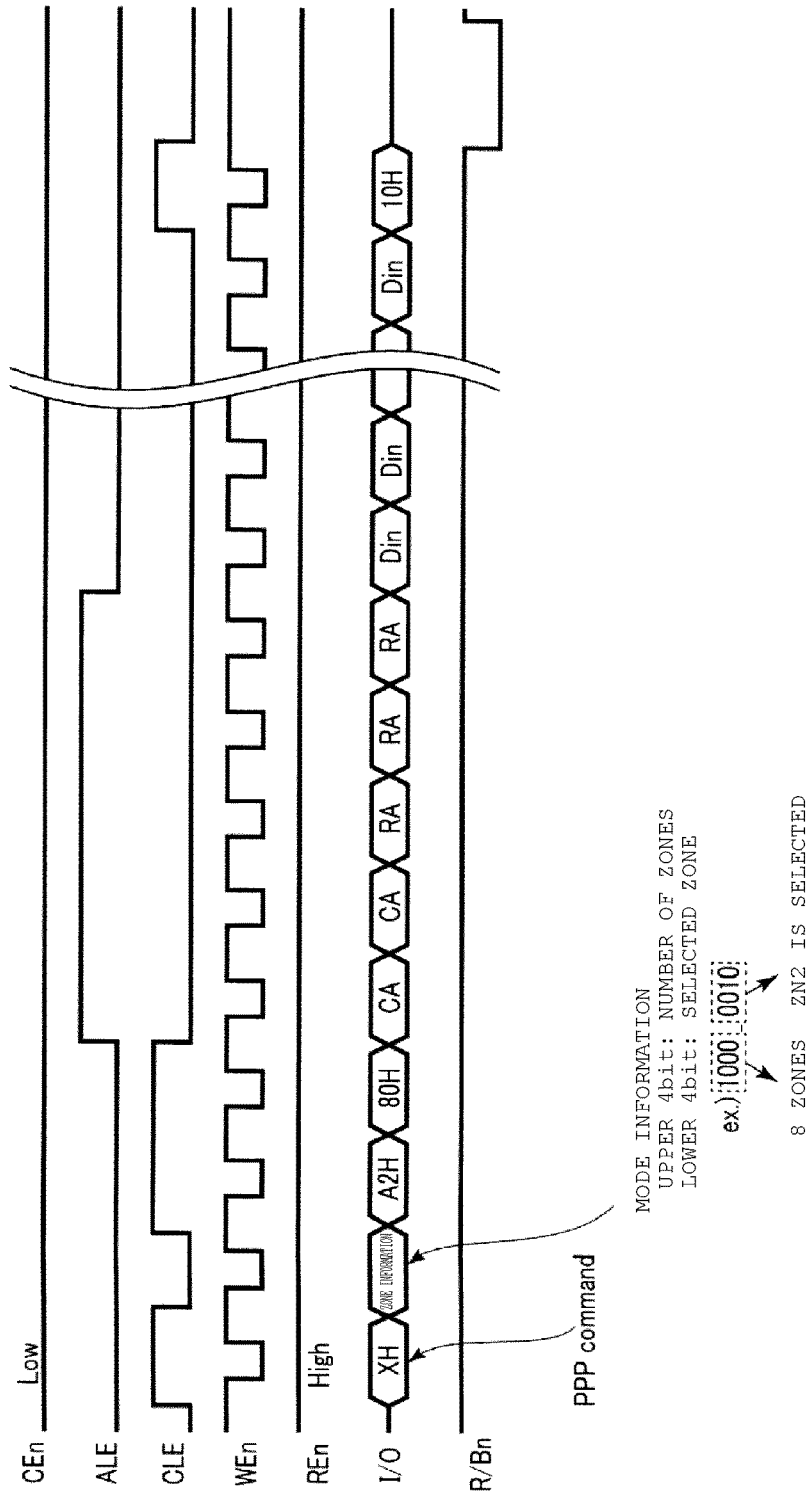
FIG. 24 is a timing chart illustrating a command sequence of a memory system according to a third embodiment.

First, an operation of a controller 200 will be described with reference to FIG. 24. FIG. 24 illustrates a command sequence during selecting a PPP mode.

As illustrated in FIG. 24, in the example, the controller 200 issues zone information following a PPP command "XH" in FIG. 9 described in the first embodiment. The zone information is, for example, 8-bit data, upper 4 bits designate the number of the zones, and lower 4 bits designate the selected zone. Thus, if the upper 4 bits are "0010", the 2 PPP mode is selected, if the upper 4 bits are "0100", the 4 PPP mode is selected, and if the upper 4 bits are "1000", the 8 PPP mode is selected. Then, if the lower 4 bits are "0000", the zone ZN0 is selected, if the lower 4 bits are "0001", the zone ZN1 is selected, if the lower 4 bits are "0010", the zone ZN2 is selected, and this is the same hereinafter. In other words, the zone information indicates which PPP mode will be executed and which zone is selected in the selected PPP mode. Additionally, the zone information is a setting value for an operation and may be referred to as mode information. Of course, mode information may be designated in ways that are different from the example, and the mode information is sufficient as long as the number of the zones and the selected zone are designated.

3.2 Operation of NAND Flash Memory 100

Figure 25:
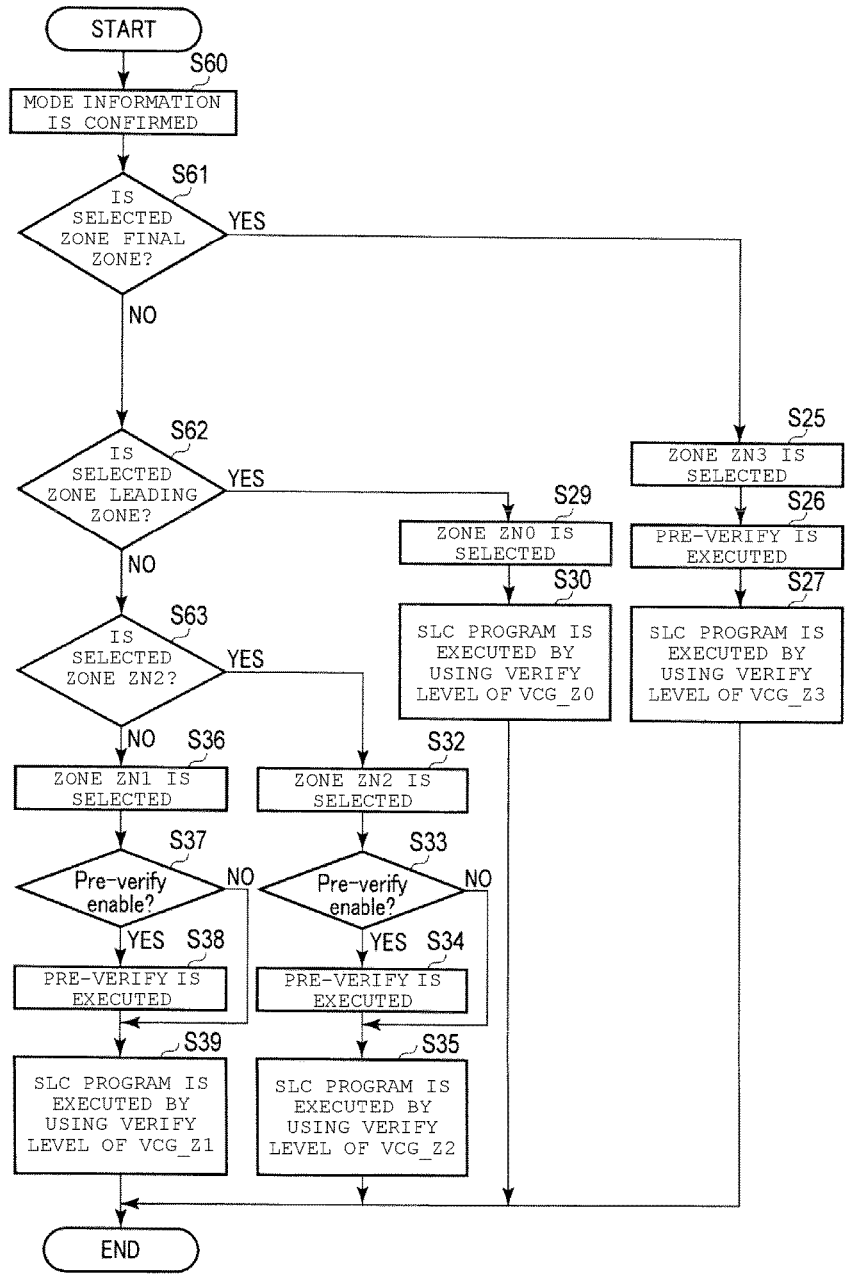
FIG. 25 is a flowchart illustrating an operation of a semiconductor memory device according to the third embodiment.

Next, an operation of a NAND flash memory 100 will be described with reference to FIG. 25. FIG. 25 is a flowchart illustrating the operation of the NAND flash memory 100 in a 4 PPP mode and corresponds to step S51 in FIG. 23 described in the second embodiment.

The sequencer 180, after recognizing the 4 PPP mode based on an upper 4 bits of a mode command, sequentially confirms lower 4 bits of mode information (step S60). Then, the sequencer 180 recognizes the selected zone based on the lower 4 bits of the mode information (steps S61 to S63). The others are the same as those of the first embodiment. Moreover, since the selected zone can be recognized by the mode information, decode of a column address by a column decoder 150 is not necessary. That is, a zone that is designated by the column selector 140 may be selected according to a command of the sequencer 180.

3.3 Effects of Embodiment

As the embodiment, the number of the zones and the selected zone within 1 page may be notified from the controller 200 to the NAND flash memory 100.

4. Modification Example, and the Like

As described above, the memory system according to the embodiments includes the semiconductor memory device that includes the plurality of memory cells arranged in rows and columns; and the controller that writes data to the semiconductor memory device in any one mode of the first mode (selection of ZN0 of the PPP mode) and the second mode (selection of ZN3 of the PPP mode). In the first mode (selection of ZN0 of the PPP mode), for any one of the row addresses, data is written to the memory cells corresponding to the first column group (ZN0) that includes the first column and the second column of which addresses are consecutive, and is a part of all columns, and the memory cells corresponding to the second column group (ZN3) that includes the third column and the fourth column of which addresses are consecutive, and is different from the first column group is prohibited to be written. In the second mode (selection of ZN3 of the PPP mode), data is written to the memory cells corresponding to the second column group (ZN3) and the memory cells corresponding to the first column group (ZN0) is prohibited to be written. The semiconductor memory device uses a first setting value in the first mode (when selecting the ZN0) and uses a second setting value that is different from the first setting value in the second mode (when selecting the ZN3) for operation setting values of the word line during the write operation (FIG. 5).

Alternatively, in the memory system, data is written using a first voltage (VCG_Z0) in the first mode (selection of the ZN0 of the PPP mode) as the verify voltage. Then, in the second mode (selection of the ZN3 of the PPP mode), data is written in the memory cell of the memory cells corresponding to the second column group (ZN3), and the memory cells corresponding to the first column group (ZN0), of which the threshold voltage is between the first voltage and the second voltage, by using the second voltage (VCG_Z3) different from the first voltage (VCG_Z0) as a verify voltage (FIGS. 11 and 16).

According to the configuration, even if writing is performed in the data unit less than the page size, it is possible to substantially uniformly align the threshold voltage distribution within the same page. Thus, data retention characteristics by the memory cell transistor are improved and it is possible to improve operation reliability of the semiconductor memory device and the memory system.

Moreover, the embodiments are not limited to the above descriptions and various modifications are possible. For example, in the embodiments described above, the 2 PPP mode and the 4 PPP mode are described as an example, but an 8 PPP mode, a 16 PPP mode, a 32 PPP mode may be provided. If the page size is 16 KB, in a case of the 8 PPP mode, 1 page is divided into 8 zones of 2 KB respectively. In a case of the 16 PPP mode, 1 page is divided into 16 zones of 1 KB respectively. In a case of the 32 PPP mode, 1 page is divided into 32 zones of 512 bytes respectively. As described above, it is possible to appropriately select whether 1 page is divided into several zones or which mode is supported.

Figure 26:
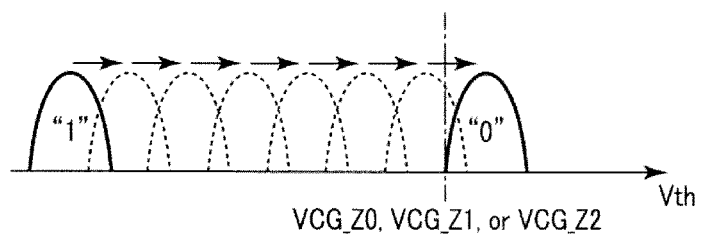
FIG. 26 is a schematic diagram illustrating changes in a threshold voltage distribution of memory cells when memory cells in zones other than a final zone is written in a semiconductor memory device according to a modification example of the first to third embodiments.
Figure 27:
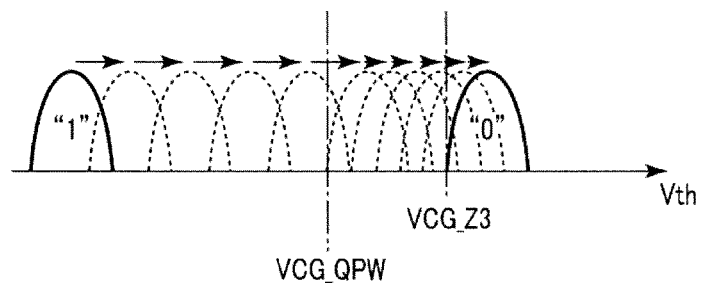
FIG. 27 is a schematic diagram illustrating changes in a threshold voltage distribution of memory cells when memory cells in a final zone is written in the semiconductor memory device according to the modification example of the first to third embodiments.

Furthermore, the conditions of the bit line during writing of "0" data may be different between during selecting the final zone and during selecting other zones. This state is illustrated in FIGS. 26 and 27. FIGS. 26 and 27 illustrate variation in the threshold voltage distribution during writing. FIG. 26 illustrates when zones other than the final zone are selected and FIG. 27 illustrates when the final zone is selected.

As illustrated in FIG. 26, if the zones other than the final zone are selected, the potential of the bit line BL is a constant value (for example, 0 V) until the threshold voltage reaches a desire value VCG_Z0, VCG_Z1, or VCG_Z2 (case of 4 PPP). Thus, the variation in the threshold voltage by one program is substantially constant in the period of the write operation.

On the other hand, as illustrated in FIG. 27, if the final zone is selected, a verify level VCG_QPW that is smaller than the desired value VCG_Z3 is initially set. Then, the potential of the bit line BL is, for example, 0 V until the threshold voltage reaches VCG_QPW. After the threshold voltage reaches VCG_QPW, the potential of the bit line BL is set be a higher voltage and the program is started again. The potential of the bit line BL becomes high voltage and thereby a potential difference between the charge storage layer and the channel becomes small and the variation amount of the threshold voltage also becomes small. Of course, during selecting the final zone, the memory cell transistors which fail in pre-verify in the other zones are also programmed in the same method.

According to this method, writing is roughly performed at a stage distant to the threshold voltage distribution that is the target and writing is finely performed at a stage close to the threshold voltage distribution. Accordingly, it is possible to achieve both improvement of a write speed and writing with high accuracy.

In addition, in the embodiments described above, the case where pre-verify is performed only during selecting the final zone and the verify level during selecting the final zone is higher than the verify level during selecting the other zone is described as an example. However, the configuration is not limited to the case. FIG. 28 illustrates a variation of the threshold voltage distribution if pre-verify is performed during selecting the zone ZN2 in the 4 PPP mode. In this case, when selecting the zone ZN2, the program is also performed with respect to a memory cell in which additional writing is necessary as a result of pre-verify.

Thereafter, when selecting the zone ZN3, the threshold voltage of the memory cell transistors corresponding to the zones ZN0 to ZN2 is varied due to the influence of erroneous writing, but the influence of erroneous writing received by the memory cell transistor storing the "0" data is only by the influence during writing of the zone ZN3. Thus, if the threshold voltage variation of this level can be allowed, pre-verify is not necessarily required during selecting the final zone. In addition, in this case, the relationship of VCG_Z0≤VCG_Z1<VCG_Z2 is satisfied and the VCG_Z3 may be greater than or less than the VCG_Z2, but it is preferable to be the same. Of course, the relationship of ΔVPGM_Z0≥ΔVPGM_Z1>ΔVPGM_Z2 is satisfied. Then, the ΔVPGM_Z3 may be greater than or less than the ΔVPGM_Z2, but it is preferable to be the same.

In addition, in the embodiments described above, the case where each zone ZN is selected in order of the column address is described as an example. For example, in a case of the 4 PPP mode, the case where selection is performed in order of the zones ZN0, ZN1, ZN2, and ZN3 is described as an example. However, it is not necessarily limited to this selection order. Writing may be performed based on pre-verify and the pre-verify result during writing the zone ZN that is finally selected within the same page. For example, in the 4 PPP mode, when the zone ZN1 is finally selected, pre-verify and writing may be performed by using the write conditions regarding the zone ZN3 illustrated in FIG. 5. That is, when writing of all zones within 1 page is completed, if the threshold voltage distribution of each zone is substantially aligned, selection order of the zones ZN does not matter. Then, the condition tables described in FIGS. 5 and 20 may be tables that store a relationship between the writing orders of the respective zones and write conditions corresponding to the orders rather than tables that store a relationship between the zones ZN and the write conditions.

In addition, in the command sequence of FIG. 9 or 22, the case where the SLC command "A2H" is issued to the next of the PPP command is described as an example. However, the NAND flash memory 100 may select the SLC mode in response to receiving the PPP command. In this case, the controller 200 is not necessary to issue the SLC command "A2H".

Furthermore, a read level when reading data may use the voltage VCGR described in FIGS. 17 and 28. However, after writing of the final zone ZN, the threshold voltage of the memory cell transistor that stores the "0" data within the page is entirety shifted on the high voltage side (set to be a value equal to or greater than the verify level VCG_Z3). Thus, as the read level, a value between the VCGR and the VCG_Z3 may be used.

Furthermore, in the embodiments described above, the NAND flash memory, in which the memory cells are stacked in the three dimensions, is described as an example, but it is also possible to apply to a planar NAND flash memory in which the memory cells are arranged in two dimensions on the semiconductor substrate. Furthermore, it is not limited to the MONOS type in which the charge storage layer is formed of the insulating film and it is also possible to apply to a FG type in which the charge storage layer is formed of a conductive film.

In addition, the order of each step in the flowcharts described in the above embodiments is only an example and it is possible to replace the order if technically feasible.

If one memory cell transistor MT holds two-bit data, the threshold voltage may take one of levels of 4 types in accordance with the stored data. If the levels of 4 types are an erase level, an A level, a B level, and a C level sequentially from a low side, a voltage that is applied to the selected word line during the read operation of the A level may be, for example, between 0 V and 0.55 V. The voltage is not limited thereto and may be between any one of 0.1 V and 0.24 V, 0.21 V and 0.31 V, 0.31 V and 0.4 V, 0.4 V and 0.5 V, 0.5 V and 0.55 V, and the like. A voltage applied to the selected word line during reading of the B level is, for example, between 1.5 V and 2.3 V. The voltage is not limited thereto and may be between any one of 1.65 V and 1.8 V, 1.8 V and 1.95 V, 1.95 V and 2.1 V, 2.1 V and 2.3 V, and the like. A voltage applied to the selected word line during reading of the C level is, for example, between 3.0 V and 4.0 V. The voltage is not limited thereto and may be between any one of 3.0 V and 3.2 V, 3.2 V and 3.4 V, 3.4 V and 3.5 V, 3.5 V and 3.6 V, 3.6 V and 4.0 V, and the like. A time (tR) of the read operation may be, for example, between any one of 25 μs and 38 μs, 38 μs and 70 μs, 70 μs and 80 μs, and the like.

The write operation includes the program and the program verify. In the write operation, a voltage that is initially applied to the selected word line during program is, for example, between 13.7 V and 14.3 V. The voltage is not limited thereto and, for example, may be between any one of 13.7 V and 14.0 V, 14.0 V and 14.6 V, and the like. Also, a voltage initially applied to the word line selected when writing an odd-numbered word line may be different from a voltage initially applied to the word line selected when writing an even-numbered word line. When the program operation is performed in an incremental step pulse program (ISPP), as a voltage of a step-up, for example, approximately 0.5 V is provided. A voltage applied to a non-selected word line may be, for example, between 6.0 V and 7.3 V. The voltage is not limited thereto and may be between 7.3 V and 8.4 V, or may be equal to or less than 6.0V. A pass voltage to be applied may be different depending on whether the non-selected word line is an odd-numbered word line or an even-numbered word line. A time (tProg) of the write operation may be, for example, between 1700 µs and 1800 µs, 1800 µs and 1900 µs, and 1900 µs and 2000 µs.

In the erase operation, a voltage initially applied to the well, which is arranged on an upper portion of the semiconductor substrate and on which the memory cells are arranged, is, for example, between 12 V and 13.6 V. The voltage is not limited thereto and may be, for example, between any one of 13.6 V and 14.8 V, 14.8 V and 19.0 V, 19.0 V and 19.8 V, 19.8 V and 21 V, and the like. A time (tErase) of the erase operation may be, for example, between 3000 µs and 4000 µs, 4000 µs and 5000 µs, and 5000 µs and 9000 µs.

In addition, the memory cell may include a structure exemplified below. The memory cell has a charge storage film arranged on the semiconductor substrate such as a silicon substrate via a tunnel insulating film a film thickness of which is 4 nm to 10 nm. The charge storage film can be a stacked structure of an insulating film such as a silicon nitride (SiN) film or a silicon oxynitride (SiON) a film thickness of which is 2 nm to 3 nm, and a polysilicon (Poly-Si) film a film thickness of which is 3 nm to 8 nm. Metal such as ruthenium (Ru) may be added to the polysilicon film. The memory cell has the insulating film on the charge storage film. The insulating film has, for example, a silicon oxide ($SiO_x$) film a film thickness of which is 4 nm to 10 nm, which is interposed between a lower layer High-k film a film thickness of which is 3 nm to 10 nm and an upper layer High-k film a film thickness of which is 3 nm to 10 nm. A material of the High-k film may be hafnium oxide (HfO) and the like. In addition, the film thickness of the silicon oxide film can be thicker than the film thickness of the High-k film. A control electrode a film thickness of which is 30 nm to 70 nm is provided on the insulating film via a film having a thickness of 3 nm to 10 nm. Here, such a film is, for example, a metal oxide film such as tantalum oxide (TaO), a metal nitride film such as tantalum nitride (TaN), and the like. It is possible to use tungsten (W) and the like in the control electrode. It is possible to arrange an air gap between the memory cells.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
   a semiconductor memory device that includes a plurality of memory cells, the plurality of memory cells including a page of memory cells comprising first, second, third, and fourth memory cells that are in first, second, third, and fourth columns, respectively, and a word line electrically connected to gates of the page of memory cells, wherein the first and second columns have address numbers that are contiguous and the third and fourth columns have address numbers that are contiguous and do not overlap with address numbers of the first and second columns; and
   a controller configured to control the semiconductor memory device and issue a first write command or a second write command to the semiconductor memory device, wherein
   the semiconductor memory device, in response to the issued first write command, executes a first program operation on the page of memory cells and a first verify operation on the memory cells of the page using a first verify voltage, and
   the semiconductor memory device, in response to the issued second write command, executes a second program operation on a first subset of the memory cells of the page, the first subset of the memory cells including the first and second memory cells, and a second verify operation on the first subset of the memory cells using a second verify voltage when the issued second write command corresponds to the first subset of the memory cells, and executes the second program operation on a second subset of the memory cells of the page, the second subset of the memory cells including the third and fourth memory cells, and a third verify operation on the second subset of the memory cells using a third verify voltage when the issued second write command corresponds to the second subset of the memory cells.

2. The memory system according to claim 1, wherein the third verify voltage is different from the second verify voltage.

3. The memory system according to claim 2, wherein after the second program operation on the first subset of the memory cells has been performed and the memory cells of the first subset has passed verification, the controller executes the second program operation on the second subset of the memory cells.

4. The memory system according to claim 3, wherein the third verify voltage is greater than the second verify voltage.

5. The memory system according to claim 1, wherein
   the memory system is connectable to a host apparatus, and
   the controller is configured to issue the first write command or the second write command to the semiconductor memory device in response to a write command received from the host apparatus.

6. The memory system according to claim 3, wherein
   the semiconductor memory device executes the second program operation on the first subset of the memory cells by applying a program voltage of an increased level to the word line in multiple loops,
   the semiconductor memory device executes the second program operation on the second subset of the memory cells by applying a program voltage of an increased level to the word line in multiple loops, and
   an amount of increase in the program voltage for each subsequent loop when the second program operation is performed on the memory cells of the first subset is more than an amount of increase in the program voltage for each subsequent loop when the second program operation is performed on the memory cells of the second subset.

7. The memory system according to claim 6, wherein an increased level in the program voltage for each subsequent loop when the second program operation is performed on the memory cells of the first subset is less than an increased level in the program voltage for each subsequent loop when the second program operation is performed on the memory cells of the second subset.

8. The memory system according to claim 3, wherein the semiconductor memory device, in response to the issued second write command, executes a pre-verify operation on the memory cells in the first subset using the second verify voltage.

9. The memory system according to claim 8, wherein during the pre-verify operation, a first read voltage is applied to the word line followed by a second read voltage that is greater than the first read voltage.

10. The memory system according to claim 2, wherein
the issued second write command corresponding to the first subset of the memory cells specifies the address numbers of the memory cells in the first subset, and
the issued second write command corresponding to the second subset of the memory cells specifies the address numbers of the memory cells in the second subset.

11. A method of controlling a semiconductor memory device that includes a plurality of memory cells, the plurality of memory cells including a page of memory cells comprising first, second, third, and fourth memory cells that are in first, second, third, and fourth columns, respectively, and a word line electrically connected to gates of the page of memory cells, wherein the first and second columns have address numbers that are contiguous and the third and fourth columns have address numbers that are contiguous and do not overlap with address numbers of the first and second columns, the method comprising:
receiving a first write command or a second write command from a controller;
executing, in response to the received first write command, a first program operation on the page of memory cells and a first verify operation on the memory cells of the page using a first verify voltage; and
in response to the received second write command, executing a second program operation on a first subset of the memory cells of the page, the first subset of the memory cells including the first and second memory cells, and a second verify operation on the first subset of the memory cells using a second verify voltage when the received second write command corresponds to the first subset of the memory cells, and executing the second program operation on a second subset of the memory cells of the page, the second subset of the memory cells including the third and fourth memory cells, and a third verify operation on the second subset of the memory cells using a third verify voltage when the received second write command corresponds to the second subset of the memory cells.

12. The method according to claim 11, wherein the third verify voltage is different from the second verify voltage.

13. The method according to claim 12, wherein after the second program operation on the first subset of the memory cells has been performed and the memory cells of the first subset has passed verification, the second program operation on the second subset of the memory cells is executed.

14. The method according to claim 13, wherein the third verify voltage is greater than the second verify voltage.

15. The method according to claim 11, wherein
the received first write command or the second write command is issued in response to a write command received from a host apparatus.

16. The method according to claim 13, wherein
the executing the second program operation on the first subset of the memory cells includes applying a program voltage of an increased level to the word line in multiple loops,
the executing the second program operation on the second subset of the memory cells includes applying a program voltage of an increased level to the word line in multiple loops, and
an amount of increase in the program voltage for each subsequent loop when the second program operation is performed on the memory cells of the first subset is more than an amount of increase in the program voltage for each subsequent loop when the second program operation is performed on the memory cells of the second subset.

17. The method according to claim 16, wherein an increased level in the program voltage for each subsequent loop when the second program operation is performed on the memory cells of the first subset is less than an increased level in the program voltage for each subsequent loop when the second program operation is performed on the memory cells of the second subset.

18. The method according to claim 13, further comprising:
executing, in response to the received second write command, a pre-verify operation on the memory cells in the first subset using the second verify voltage.

19. The method according to claim 18, wherein during the pre-verify operation, a first read voltage is applied to the word line followed by a second read voltage that is greater than the first read voltage.

20. The method according to claim 12, wherein
the received second write command corresponding to the first subset of the memory cells specifies the address numbers of the memory cells in the first subset, and
the received second write command corresponding to the second subset of the memory cells specifies the address numbers of the memory cells in the second subset.

* * * * *